United States Patent
Narayan et al.

(10) Patent No.: US 9,602,084 B2
(45) Date of Patent: Mar. 21, 2017

(54) FREQUENCY DETECTOR AND OSCILLATOR CIRCUIT

(71) Applicant: TEXAS INSTRUMENTS INCORPORATED, Dallas, TX (US)

(72) Inventors: Subramanian Jagdish Narayan, Bangalore (IN); Dipankar Mandal, Bangalore (IN); Janakiraman Seetharaman, Bangalore (IN); Kiran Godbole, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/966,616

(22) Filed: Dec. 11, 2015

(65) Prior Publication Data

US 2016/0308516 A1 Oct. 20, 2016

Related U.S. Application Data

(60) Provisional application No. 62/150,034, filed on Apr. 20, 2015.

(51) Int. Cl.
 *G01R 23/02* (2006.01)
 *H03K 3/037* (2006.01)
 *G01R 19/165* (2006.01)

(52) U.S. Cl.
 CPC ......... *H03K 3/037* (2013.01); *G01R 19/1659* (2013.01)

(58) Field of Classification Search
 None
 See application file for complete search history.

(56) References Cited

U.S. PATENT DOCUMENTS 8,134,393 B1 * 3/2012 Nagaraj ............... H03L 7/083
 327/147
9,274,151 B2 * 3/2016 Lee ..................... G01R 23/00

* cited by examiner

*Primary Examiner* — Cassandra Cox
(74) *Attorney, Agent, or Firm* — Gregory J. Albin; Charles A. Brill; Frank D. Cimino

(57) ABSTRACT

Frequency detector and oscillator circuits are disclosed. Example frequency detector and oscillator circuits disclosed herein include a current approximation circuit coupled to an external clock operating at a target frequency. In some examples, the current approximation circuit is configured to determine a magnitude of a first current to charge a capacitor to reach a reference voltage during a first set of clock cycles generated by the external clock. In some examples, the current approximation circuit is further configured to generate an output current based on the magnitude of the first current and to use the output current to produce a comparator output. In some examples, the frequency detector and oscillator circuits further include a latching circuit coupled to receive the comparator output from the current approximation circuit. In some such examples, the latching circuit is configured to generate oscillating signals at the target frequency based on the comparator output.

19 Claims, 8 Drawing Sheets

FREQUENCY DETECTOR AND OSCILLATOR CIRCUIT

RELATED APPLICATIONS

This patent claims priority to U.S. Application No. 62/150,034, which was filed on Apr. 20, 2015, and is hereby incorporated herein by reference in its entirety.

FIELD OF THE DISCLOSURE

This disclosure relates generally to frequency detection and, more particularly, to detecting the frequency of an external clock and generating an oscillator signal at the detected frequency.

BACKGROUND

Successive approximation analog to digital converters (ADCs) are designed to use N clock cycles (typically generated by an external clock) to convert an analog signal to a set of N digital bits. Recently, there is a desire to improve the performance of such successive approximation ADCs using enhanced error correction techniques such as digital error correction (DEC) and mismatch error correction (MEC). Performing enhanced error correction techniques may require the usage of additional clock cycles beyond the N cycles available via a standard external clock.

SUMMARY

The methods and apparatus disclosed herein relate generally to frequency detector and oscillator circuits. Some example frequency detector and oscillator circuits disclosed herein include a current approximation circuit coupled to an external clock operating at a target frequency. In some examples, the current approximation circuit is configured to determine a magnitude of a first current to charge a capacitor to reach a reference voltage during a first set of clock cycles generated by the external clock. In some examples, the current approximation circuit is further configured to generate an output current based on the magnitude of the first current and to use the output current to produce a comparator output. In some examples, the frequency detector and oscillator circuits further include a latching circuit coupled to receive the comparator output from the current approximation circuit. In some such examples, the latching circuit is configured to generate oscillating signals at the target frequency based on the comparator output.

In some examples, the current approximation circuit is a first current approximation circuit, the magnitude of the first current is a first magnitude, the output current is a first output current, the capacitor is a first capacitor, and the comparator output is a first comparator output. In some such examples, the frequency detector and oscillator circuits further include a second current approximation circuit coupled to the external clock that is configured to determine a second magnitude of a second current to charge a second capacitor to reach the reference voltage during the first set of clock cycles generated by the external clock. Some such example second current approximation circuits are also configured to generate a second output current based on the second magnitude of the second current, and to use the second output current to produce a second comparator output. In some such examples, the latching circuit is coupled to the second comparator output and is configured to generate oscillating signals at the target frequency based on the second comparator output.

In further examples, the frequency detector and oscillator circuit includes a first binary search circuit having a first binary search circuit input and a first set of control outputs and also includes a first set of current sources that each have an input coupled to and controlled by a respective one of the first set of control outputs. Each of the first set of current sources also has a respective current source output. In some examples, the current source outputs of the respective current sources are coupled together and current supplied by the first set of current source outputs charges the first capacitor to generate a first capacitor voltage. In some examples, the first binary search circuit includes a first comparator having a first comparator input coupled to the capacitor and a second comparator input coupled to a voltage source configured to generate the reference voltage. In some examples, the first comparator is configured to compare the first capacitor voltage with the reference voltage and the first comparator includes a comparator output that is coupled to the first binary search circuit input.

In some examples, the frequency detector and oscillator circuit further includes a switch that couples the current source outputs of the first set of current sources to the first capacitor for a threshold amount of time during each of the first set of clock cycles generated by the external clock. In still further examples, the switch also couples the current source outputs of the first set of current sources to the first capacitor based on an output of the latching circuit. In some examples, the example latching circuit causes the switch to couple the current source outputs of the first set of current sources to the first capacitor when the latching circuit output is at a first logic level and to decouple the current source outputs of the first set of current sources from the first capacitor when the latching circuit output is at a second logic level.

In yet further examples, frequency detector and oscillator circuits disclosed herein also include a multiplexing device having a first input coupled to the output of the external clock, a second input coupled to the latching circuit output and an output coupled to the analog to digital converter. The multiplexing device causes a first set of clock pulses to be supplied by the output of the external clock to the analog to digital converter for the first set of clock cycles and causes the oscillating signals generated by the latching circuit to be supplied to the analog to digital converter after the first set of clock cycles.

In still other examples, the frequency detector and oscillator circuits disclosed herein additionally include a current calculating circuit that is coupled to a third output of the first current approximation circuit and to a fourth output of the second current approximation circuit. In some such examples, the current calculating circuit is configured to receive a first set of bits representing the first magnitude of current from the first current approximation circuit, to receive a second set of bits representing the second magnitude of current from the second current approximation circuit, and to generate a third set of bits based on the first set of bits and the second set of bits. In some examples, the third set of bits represent a third magnitude of the output current. In some examples, the current calculating circuit supplies the third set of bits to the first binary search circuit of the first current approximation circuit and to a second binary search circuit of the second current approximation circuit. The first binary search circuit is configured to use the third set of bits to cause the first set of current sources to supply the third magnitude of current to the first capacitor until the first capacitor voltage reaches or exceeds the reference voltage, and the second binary search circuit is configured to use the third set of bits to cause a second set of current sources to supply the third magnitude of current to a second capacitor until the second capacitor voltage reaches or exceeds the reference voltage.

In yet further examples, the latching circuit output of the latching circuit toggles from a first logic level to a second logic level when the first capacitor voltage reaches or exceeds the reference voltage and toggles from the second logic level to the first logic level when the second capacitor voltage reaches or exceeds equal to the reference voltage. In some examples, the third magnitude of the output current determines the target frequency at which the latching circuit generates oscillating signals.

Some example methods disclosed herein are used to detect a target frequency at which a clock is operating and to generate oscillating signals at the target frequency. Some such example methods include determining a first magnitude of a first current to charge a first capacitor to a predetermined voltage during a first portion of a first clock signal operating at the target frequency and determining a second magnitude of a second current to charge a second capacitor to the predetermined voltage during a second portion of the first clock signal. Such example methods can also include alternately delivering a third current having a third magnitude to the first capacitor and to the second capacitor to cause a latching device to generate the oscillating signals at the target frequency. In some such example methods, the third magnitude of the third current is based on the first magnitude of the first current and the second magnitude of second current.

In some example methods disclosed herein determining the first magnitude of the first current includes initially setting each respective current source of a first plurality of current sources to an activated state in response to a respective pulse of a first plurality of pulses of the first clock signal and after each respective pulse of the first plurality of pulses, making a respective comparison between a first capacitor voltage occurring across the first capacitor coupled to receive current from the first plurality of current sources and a reference voltage. Some such examples further include, based on each respective comparison made after each respective pulse of the first plurality of pulses, causing the respective one of the first plurality of current sources initially set in response to the respective pulse to remain in one of an activated or de-activated state in response to subsequent ones of the first plurality of pulses.

In some examples methods, the respective current sources correspond to respective bits of a binary word that represents a quantization level and the respective current sources are initially set to the activated state in an order based on a significance of the corresponding bit. In some such examples, a first current source of the plurality of current sources corresponds to a most significant bit in the binary word and is initially set to the activated state in response to a first pulse of the first plurality of pulses and a second current source corresponding to a least significant bit in the binary word is initially set to the activated state in response to a last pulse of the first plurality of pulses. In some examples, the first portion of the first clock signal corresponds to the first clock signal being at a first logic level and the second portion of the first clock signal corresponds to the first clock signal being at a second logic level.

In some example methods, determining the first magnitude of the first current includes making a first set of comparisons between a plurality of first capacitor voltages across the first capacitor coupled to receive current from the first plurality of current sources and the predetermined voltage and determining the second magnitude of the second current includes making a second set of comparisons between a plurality of second capacitor voltages occurring across the second capacitor coupled to receive current from a second plurality of current sources and the predetermined voltage. Some such example methods also include, based on respective ones of the first set of comparisons, determining whether to adjust respective amounts of current generated by respective ones of the first plurality of current sources, and, based on respective ones of the second set of comparisons, determining whether to adjust respective amounts of current generated by respective ones of the second plurality of current sources.

In some example methods disclosed herein, alternately delivering a third current having a third magnitude to the first capacitor and to the second capacitor to cause the latching circuit to generate the oscillating signals at the target frequency includes delivering the third current to the first capacitor until the first capacitor reaches or exceeds the reference voltage and causes a first comparator output to change. Some such example methods also include latching the first comparator output with a latching circuit to cause an output of the latching circuit to supply a first signal for a first duration of time and delivering the third current to the second capacitor until the second capacitor reaches or exceeds the reference voltage and causes a second comparator output to change. Such example methods also include latching the second comparator output with the latching circuit to cause the output of the latching circuit to supply a second signal for a second duration of time. In some such example methods, the sum of the first duration of time and the second duration of time is equal to a clock cycle of the first clock signal.

These and other example methods, apparatus, systems and articles of manufacture to implement the frequency detector and oscillator circuit 110 are disclosed in greater detail below.

BRIEF DESCRIPTION OF THE DRAWINGS

Wherever possible, the same reference numbers will be used throughout the drawing(s) and accompanying written description to refer to the same or like parts, elements, etc.

DETAILED DESCRIPTION

Figure 1:
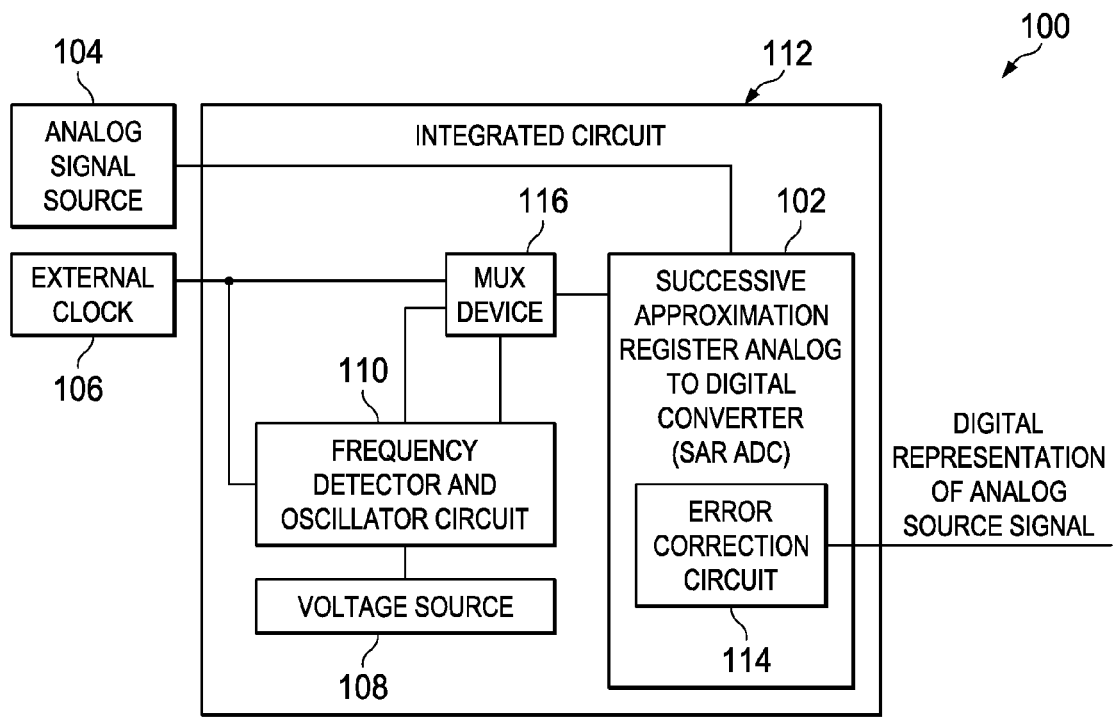
FIG. 1 is a block diagram of an example analog to digital conversion system having an example frequency detector and oscillator circuit.

Certain examples are shown in the above-identified figures and described in detail below. In describing these examples, like or identical reference numbers may be used to identify common or similar elements. The figures are not necessarily to scale and certain features and certain views of the figures may be shown exaggerated in scale or in schematic for clarity and/or conciseness. Although the following discloses example methods and apparatus, it should be noted that such methods and apparatus are merely illustrative and should not be considered as limiting. The example circuits described herein may be implemented using discrete components, integrated circuits (ICs), or any combination thereof.

Additionally, it is contemplated that any form of logic or circuitry may be used to implement portions of apparatus or methods herein. Logic or circuitry may include, for example, circuit implementations that are made exclusively in dedicated hardware (e.g., circuits, transistors, logic gates, hard-coded processors, programmable array logic (PAL), application-specific integrated circuits (ASICs), etc.), exclusively in software, exclusively in firmware, or some combination of hardware, firmware, and/or software. Accordingly, while the following describes example methods and apparatus, persons of ordinary skill in the art will readily appreciate that the examples are not the only way to implement such apparatus.

Successive approximation analog to digital converters (ADCs) are typically designed to use N clock cycles (generated by an external clock) to convert an analog signal to a set of N digital bits. Recently, there is a desire to improve the performance of such successive approximation ADCs using enhanced error correction techniques such as DEC and MEC. Performing enhanced error correction techniques may require the usage of additional clock cycles beyond the N clock cycles available using a standard external clock. However, adding an additional external clock for use in generating the additional clock cycles may not be an option for successive approximation ADCs having a standard legacy interface. An internal oscillator can be used to generate the additional clock cycles but the frequency of such internal oscillators can vary greatly due to changes in the environment in which the internal oscillator is operating (e.g., changes in temperature and pressure). When the frequency of the internal oscillator changes, the external clock and internal oscillator may fall out of sync relative to each other which may adversely affect operation of the successive approximation ADC. Although trimming can be performed on the internal oscillator to compensate for such changes, trimming may require the addition of an external interface which may be infeasible in an integrated circuit package having a low pin count. Further, trimming can be performed only once. As such, any future changes to the environment may no longer be compensated for and any changes to the frequency of the external clock may again cause the external clock and internal oscillator to become asynchronous.

The techniques of the disclosure may use an external clock to generate the first N clock cycles and use an internal oscillator to generate any additionally needed clock cycles for performing error correction techniques. To overcome the concerns described above, portions of an example frequency detector and oscillator circuit, as described further below, may use a successive approximation technique to detect/identify a frequency of the external clock during the generation of the first N cycles. Portions of the frequency detector and oscillator circuit may then be used to operate as an oscillator that generates oscillating signals at the identified/detected frequency of the external clock, thereby keeping the operation of the internal oscillator and the external clock synchronized. Thus, there is no need for an additional external clock to generate additional clock cycles. As such, successive approximation ADCs having a standard legacy interface are supported by example frequency detector and oscillator circuits described herein. Further, as described below, there is no need to provide an input by which an internal oscillator is to be trimmed such that pin count is reduced, thereby supporting successive approximation ADCs having a legacy interface. In addition, the area occupied by disclosed example the frequency detector and oscillator circuits on their respective integrated circuits may be reduced because some circuit elements, such as one time programmable (OTP) fuses and register bits, may no longer be needed and can be eliminated. Also, if the frequency tracking device described herein is fully untrimmed, the device interface may be simplified thereby leading to further area reduction. Additionally, the frequency of the external clock is detected on-the-fly so that the frequency of the external clock can be changed without adversely affecting the operation of the frequency detector and oscillator circuit. Moreover, various elements of the frequency detector and oscillator circuit may be used to both generate the oscillating signals and perform the frequency tracking methods described below, thereby eliminating and/or reducing any mismatch (which might otherwise degrade the accuracy of the results generated by the frequency tracking methods). As a result, the accuracy of the frequency identified by example frequency detector and oscillator circuits described below may, in some examples, be primarily limited by the quantization accuracy of a successive approximation technique used to identify the frequency of the external clock. Additionally, repurposing some of the circuit elements used to perform the internal oscillator operations in the manner described herein may further serve to reduce surface area by eliminating the need for duplicate circuit elements.

FIG. 1 is a block diagram representative of an example analog to digital (A/D) conversion system 100 that includes a successive approximation register analog to digital converter (SAR ADC) 102 to convert an analog signal supplied by any analog signal source 104 to a digital signal. The A/D conversion system 100 further includes an example external clock 106, an example voltage source 108, and an example frequency detector and oscillator circuit 110. In some examples, the frequency detector and oscillator circuit 110, the SAR ADC 102, and the voltage source 108 are all disposed on a same integrated circuit 112. Although the examples provided herein are described as being used in conjunction with an SAR ADC 102, the frequency detector and oscillator circuit 110 described herein can be used in any circuit where additional clock cycles (beyond the number of clock cycles provided via an external clock) are needed. Further, in some examples, as described below, one or more (or all) of the elements of the frequency detector and oscillator circuit 110 are circuit elements that are included in the SAR ADC 102. In some examples, and as described below, one or more circuit elements of the frequency detector and oscillator circuit 110 are used to operate in one or both of a frequency detection mode and an oscillator mode.

In some examples, the example external clock 106 operates at a target frequency to generate a plurality of pulses that are supplied to the example SAR ADC 102. The SAR ADC 102 uses a first set of "N" pulses generated by the external clock 106 to convert a first sample of an analog signal supplied by the example analog signal source 104 into a set of digital bits based on the N clock pulses generated by the external clock 106. The value of N can be any value such as, for example, 8, 16, 32, etc. The analog signal source 104 can be any device capable of generating an analog signal. In some examples, the plurality of pulses generated by the external clock 106 are further supplied to the example frequency detector and oscillator circuit 110 which operates to detect a frequency at which the external clock 106 is generating the pulses. In some examples, as described further below in connection with FIGS. 2 and 3, the frequency detector and oscillator circuit 110 uses a successive approximation technique to determine a frequency at which the external clock 106 is operating. In some examples, after the frequency detector and oscillator circuit 110 determines the frequency of the external clock during a first set of N clock pulses, the frequency detector and oscillator circuit 110 generates a set of "M" pulses at approximately the external clock frequency. The value of M can be any value including, for example, 4, 8, 16, etc. In the illustrate example of FIG. 1, the M clock pulses are delivered to the SAR ADC 102 for usage by an example error correction circuit 114 associated with the SAR ADC 102. The error correction circuit 114 uses the set of M internally generated oscillating pulses to generate an additional set of digital bits which can be used to correct potential errors occurring in an initial result created by the SAR ADC 102 based on the N clock pulses generated by the external clock 106. For example, the M pulses generated by the frequency detector and oscillator circuit 110 can be used to tune the digital bits associated with the first sample of the analog signal. Thus, the first set of digital bits computed in the initial N cycles are operated on by the error correction circuit 114 based on the M set of pulses generated by the frequency detector and oscillator circuit 110. In some examples, the external clock 106 is not continuously operating but rather stops generating clock pulses after the first N clock pulses and resumes generating a second set of N clock pulses after the frequency detector and oscillator circuit 110 has finished generating the first set of M clock pulses, and so on. In some examples, the N clock pulses and the M clock pulses are alternately delivered to the SAR ADC 102 via an example multiplexing (MUX) device 116.

As shown in FIG. 1, the example frequency detector and oscillator circuit 110 has a first input that is coupled to the example external clock 106 (e.g., via an external clock input pin of the example integrated circuit 112), a second input that is coupled to an output of the example voltage source 108, and an output that is coupled to an input of the example multiplexing device 116. The external clock 106 is also coupled (via an external clock input pin of the integrated circuit 112) to an input of the multiplexing device 116 and an output of the multiplexing device 116 is coupled to an input of the SAR ADC 102. The SAR ADC 102 also includes an analog data input coupled to the analog signal source 104 (e.g., via an analog signal source pin of the integrated circuit 112), and a digital output coupled to one or more digital output pins of the integrated circuit 112.

Figure 2:
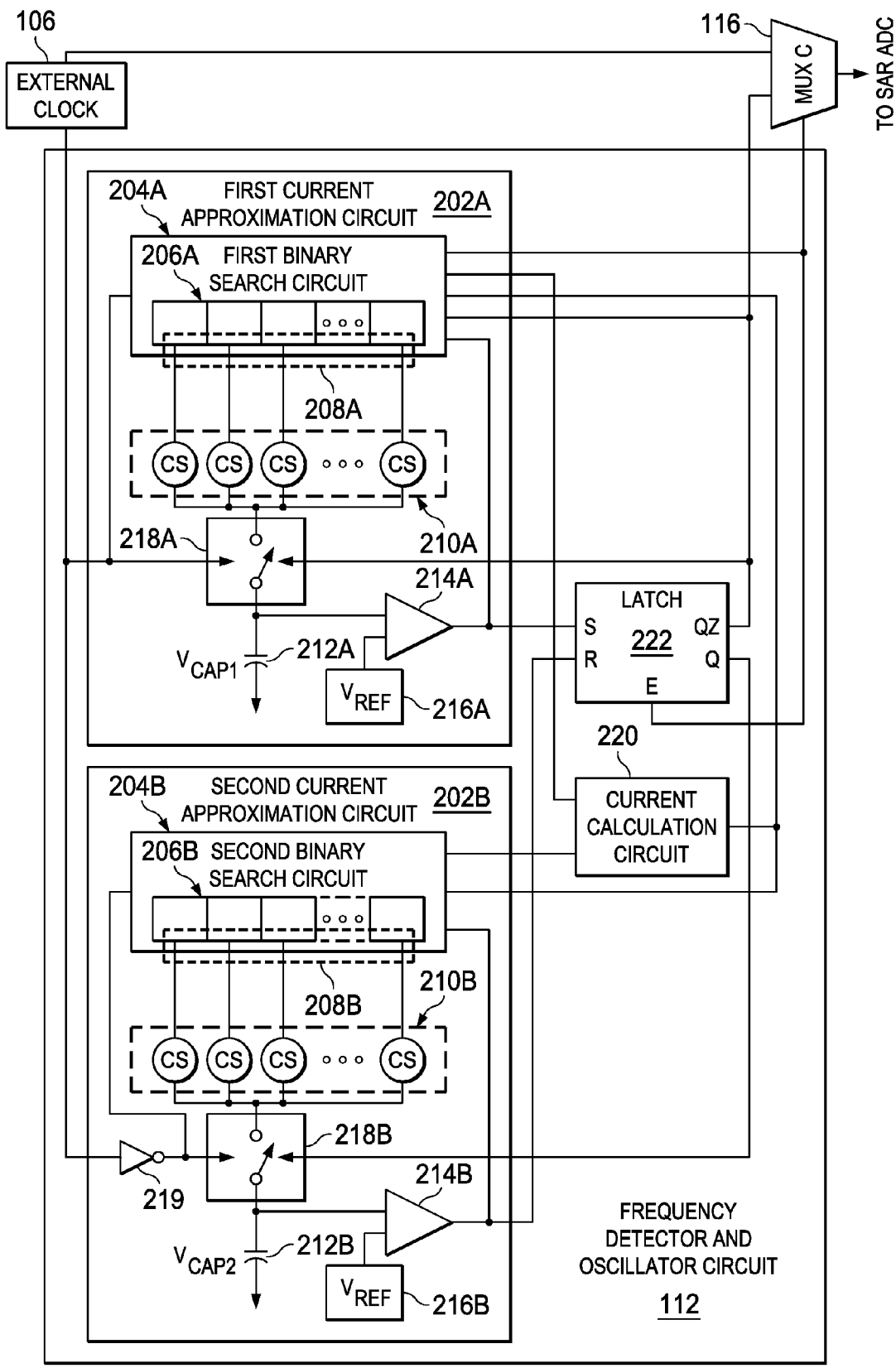
FIG. 2 is a schematic diagram of an example implementation of the example frequency detector and oscillator circuit of FIG. 1.

FIG. 2 is a schematic diagram of an example implementation of the example frequency detector and oscillator circuit 110 of FIG. 1. The example frequency detector and oscillator circuit 110 includes an example first current approximation circuit 202A and an example second current approximation circuit 202B. The first current approximation circuit 202A includes an example first binary search circuit 204A having an example first binary search register 206A and having an example first set of outputs 208A. The first current approximation circuit 202A also includes an example first set of current sources 210A, an example first capacitor 212A, an example first comparator 214A, an example first reference voltage source ("$V_{REF}$") 216A, and an example first switch 218A. As illustrated in FIG. 2, an output of the external clock 106 (also illustrated in FIG. 1) is coupled to the first switch 218A and controls the first switch 218A when the frequency detector and oscillator circuit 110 is operating in a frequency detection mode as described further below. The second current approximation circuit 202B includes an example second binary search circuit 204B having an example second binary search register 206B and having an example second set of outputs 208B. The second current approximation circuit 202B also includes an example second set of current sources 210B, an example second capacitor 212B, an example second comparator 214B, an example second voltage source 216B, and an example second switch 218B. The output of the external clock 106 is coupled to the second switch 218B via an example inverter 219 and controls the second switch 218B when the frequency detector and oscillator circuit 110 is operating in the frequency detection mode as described further below. In some examples, the frequency detector and oscillator circuit 110 further includes an example current calculating circuit 220 coupled to the first binary search circuit 204A and to the second binary search circuit 204B.

In some examples, the frequency detector and oscillator circuit 110 further includes an example latching circuit implemented using, for example, an S-R latch 222 having a first input ("S") coupled to an output of the first comparator 214A and a second input ("R") coupled to an output of the second comparator 214B. A first output ("QZ") of the S-R latch 222 is coupled to control the first switch 218A when the frequency detector and oscillator circuit 110 is operating in an oscillator mode and a second output ("Q") of the S-R latch 222 is coupled to control the second switch 218B when the frequency detector and oscillator circuit 110 is operating in the oscillator mode. The first output QZ of the S-R latch 222 is further coupled to a first input of the example multiplexing device 116 (also shown in FIG. 1). An output of the external clock 106 is coupled to a second input of the multiplexing device 116. The output of the multiplexing device 116 is supplied to the SAR ADC 102 (see FIG. 1). In some examples, the multiplexing device 116 is configured to supply the external clock signal to the SAR ADC 102 when the frequency detector and oscillator circuit 112 is operating in a frequency detection mode and is configured to supply the QZ output signal of the S-R latch 222 to the SAR ADC 102 when the frequency detector and oscillator circuit 110 is operating in an oscillator mode. In some examples, the S-R latch 222 includes an enable input ("E") that is coupled to receive a signal from the first binary search circuit 204A and the multiplexing device 116 includes an control input ("C") that is coupled to receive a signal from the first binary search circuit 204A. As described further below, when the first binary search circuit 204A supplies a signal to the E input of the S-R latch 222, the S-R latch begins operating and when the first binary search circuit 204A supplies a signal to the C input of the multiplexing device 116, the multiplexing device 116 begins supplying the QZ output of the S-R latch 222 to the SAR ADC 102 instead of the external clock signal.

Referring still to FIG. 2, the example first binary search circuit 204A of the first current approximation circuit 202A operates to activate and de-activate the example first set of current sources 210A, which, in turn, supply current to the example first capacitor 212A causing the first capacitor 212A to become charged to a voltage level referred to as $V_{CAP1}$. In some examples, the first set of current sources 210A (and, likewise, the example second set of current sources 210B) may be weighted current sources (e.g., binary-weighted current sources) where the magnitude of current produced by each of the current sources is weighted by a different weight or scaling factor. The example first comparator 214A compares the voltage level across the first capacitor 212A, $V_{CAP1}$, to a reference voltage $V_{REF}$ supplied by an example reference voltage source 216A. In some examples, the reference voltage source 216A is implemented using the example voltage source 108 (see FIG. 1). In some examples, the reference voltage source 216A is implemented using the voltage source 110 divided by two (or any other divisor). The output of the first comparator 214A is coupled to the first binary search circuit 204A such that the results of the comparison are supplied as an input to the first binary search circuit 204A. The first binary search circuit 204A responds to the results of the comparison by setting or resetting one or more bits in the example first binary search register 206A of the first binary search circuit 204A. In some examples, the first binary search register 206A holds N bits, each of which is associated with a respective one of the example set of outputs 208A of the first binary search circuit 204. The bits control whether the first set of current sources 210A, each of which is coupled to a respective one of the set of outputs 208A of the first binary search circuit 204A are activated or deactivated. In some examples, when a bit in the first binary search register 206A is set to a logic 1, a respective one of the first set of current sources 210A that is coupled to the associated one of the first set of outputs 208A is activated (e.g., turned on) and when the same bit is set to a logic 0, the respective one of the first set of current sources 210A that is coupled to the associated one of the first set of outputs 208A is de-activated (e.g., turned off).

As described above, an output of the example external clock 106 is coupled to control the first switch 218A when the example frequency detector and oscillator circuit 110 is operating in a frequency detection mode. Each pulse of the external clock 106 causes the first switch 218A to couple the first set of current sources 210A to the first capacitor 212A for a threshold duration of time. The duration of time may correspond, for example, to an amount of time during which the external clock signal is at a logic high value (or alternatively, a logic low value). In some examples, the first switch 218A couples the first set of current sources 210A to the first capacitor 212A on the rising edge of the clock pulse and decouples the first capacitor 212A from the first set of current sources 210A on the falling edge of the clock pulse. When coupled to the first capacitor 212A, one or more of the first set of current sources 210A deliver current to the first capacitor 212A thereby charging the first capacitor 212A. When the first set of current sources 210A are subsequently decoupled from the first capacitor 212A, the first capacitor 212A discharges. Discharge of the first capacitor 212A does not occur instantaneously upon decoupling from the first set of current sources 210A such that the first capacitor 212A retains a voltage for a short duration of time (e.g., a few nanoseconds) during which the example comparator 214A is able to compare the voltages $V_{REF}$ and $V_{CAP1}$.

In some examples, before or upon detection of a first pulse of the N pulses received from the example external clock 106, the example first binary search circuit 204A operates to set a most significant bit (referred to as a first most significant bit) in the example first binary search register 206A to a logic level high (e.g., 1) and operates to set the remaining bits in the first binary search register 206A to a logic level low (e.g., 0). As a result of the bit settings, the respective one of the first set of current sources 210A associated with the first most significant bit (e.g., tied to a respective one of the first set of outputs 208A associated with the first most significant bit) is turned on and the ones of the first set of current sources 210A associated with the remaining bits are turned off.

In some examples, after the threshold duration of time has elapsed, the example first binary search circuit 204A captures the output of the example first comparator 214A thereby determining whether the voltage $V_{CAP1}$ across the example first capacitor 208 is greater than the voltage level, $V_{REF}$, generated by the example reference voltage source 216A. If $V_{CAP1}$ is greater than $V_{REF}$, then the amount of current generated by the respective one of the example first set of current sources 210A is greater than the amount of current needed to obtain $V_{CAP1}$ equal to $V_{REF}$ and the first binary search circuit 204A causes the first most significant bit to reset to a logic level low (e.g., 0). Resetting the most significant bit to a logic level low will cause the respective one of the first set of current sources 210A to be turned off during subsequent ones of the first set of N pulses generated by the example external clock 106. If, instead, the voltage, $V_{CAP1}$, across the first capacitor 212A is less than the voltage level, $V_{REF}$, generated by the reference voltage source 216A, the amount of current generated by the respective one of the first set of current sources 210A is less than the amount of current needed to achieve $V_{CAP1} \geq V_{REF}$ and the first binary search circuit 204A causes the first most significant bit to be set to (e.g., remain set at) a logic level high (e.g., 1). Keeping the most significant bit set at a logic level high ensures that the respective one of the first set of current sources 210A will remain turned on during subsequent ones of the first set of N pulses of the external clock 106. Further, during subsequent ones of the remaining N clock pulses, the most significant bit is not changed. In addition to setting the first most significant bit based on the output of the first comparator 214A, the first binary search circuit 204A additionally, initially sets the next-most significant bit (referred to as the second most significant bit) to a logic level high (e.g., 1). The remaining bits of the example first binary search register 206A remain at a logic 0.

Upon receiving subsequent ones of the first set of N pulses from the external clock 106, the example first switch 218A operates in the same manner as described in connection with the first set of N pulses. Thus, when a second of the first set of N clock pulses is received, the first most significant bit of the example first register is either set to a one or zero based on the output of the example first comparator 214A after the first of the N pulses, the second most significant bit is set to a logic level high, and the remaining bits are set to a logic level low. As a result, a first of the first set of example current sources 210A corresponding to the first most significant bit is either activated or deactivated based on the setting of the most significant bit, a second of the first set of current sources 210A corresponding to the second most significant bit is activated (turned on), and the remaining ones of the first set of current sources 210A are deactivated (turned off).

As described with respect to the first of the N pulses, the first switch 218A couples the first set of current sources 210A to the first capacitor 212A for the threshold duration of time (e.g., while the clock pulse is at a logic level high) after which the output of the first comparator 214A is captured by the example first binary search circuit 204A. If the output of the first comparator 214A after the second external clock pulse indicates that $V_{CAP1}$ is greater than $V_{REF}$, the first binary search circuit 204A causes the second most significant bit of the first binary search register 206A to reset to a logic level low (e.g., 0). Otherwise, the first binary search circuit 204A causes the second most significant bit of the first binary search register 206A to remain set at a logic level high (e.g., 1). During subsequent ones of the remaining N pulses, the second most significant bit is not changed. In addition to setting the second most significant bit of the first binary search register 206A based on the output of the first comparator 214A, the first binary search circuit 204A additionally, initially sets the next-most significant bit (referred to as the third most significant bit) to a logic level high (e.g., 1). The remaining bits of the first binary search register 210A remain at a logic level low (e.g., 0).

During subsequent ones of the remaining N clock pulses, the example first binary search circuit 204A continues to set the remaining bits of the example first binary search register 206A using the same operations performed with respect to the first most significant bit, the second most significant bit and the third most significant bit as described above. Thus, after N pulses have been generated by the external clock 106, each of the bits in the first binary search register 206A of the first binary search circuit 204A have been set to a logic level high (e.g., 1) or a logic level low (e.g. 0) based on the outcomes of corresponding comparisons made by the example first comparator 214A. In this manner, the magnitude of the current needed to generate a capacitor voltage $V_{CAP1}$ equal to $V_{REF}$ is successively approximated during the N clock pulses. As a result, after the N clock pulses have been generated, the bits in the first binary search register 206A of the first binary search circuit 204A have been set to control respective ones of the first set of current sources 210A to generate the amount of current needed to obtain $V_{CAP1}$ equal to $V_{REF}$.

In some examples, the example first capacitor 212A is sized to have a capacitance that will limit the sensitivity of the first capacitor 212A to parasitic capacitance and that will provide good matching. In some examples, the magnitude of the reference voltage $V_{REF}$ is equal to the magnitude of the voltage provided by the example voltage source 108 (see FIG. 1) divided in half. In some examples, when the voltage source 108 (e.g., a battery or other such voltage source) provides a voltage having a magnitude of 5 volts, the reference voltage $V_{REF}$ may be set at 2 volts instead of 2.5 volts to account for decreases in voltage due to usage (e.g., battery depletion).

The frequency of the example external clock 106 (see FIG. 1 and FIG. 2) can be used to determine a magnitude of current to be supplied by each of the example first set of current sources 210A. For example, capacitor operation is represented by the equation, i=C(dv/dt), where "i" is equal to the current flowing through the capacitor, "C" is equal to the capacitance of the capacitor, and "dv/dt" is the derivative of the voltage across the capacitor over time. Given that the first set of current sources 210A (and likewise, the example second set of current sources 210B) supply a flow of current having a non-changing (e.g., constant) magnitude, the operation of the example first capacitor 212A can be represented using "i(T)=C(V)." Thus, in example applications in which 1) the first capacitor 212A has a capacitance of 200 fF, 2) the reference voltage $V_{REF}$ is equal to 2 V, and 3) the external clock 106 operates at 20 MHz (e.g., the period of the external clock is approximately 50 nanoseconds), the current to be supplied by the first set of current sources is equal to "(200 fF (2V))/50 ns," or 8 µamps. As a result, in such example applications, when the first capacitor 212A (having a capacitance of 200 fF) is charged with a current of 8 µAmps for 50 ns, the voltage across the first capacitor, $V_{CAP1}$, will equal 2V (e.g., $V_{REF}$). Thus, if the clock pulse generated by the external clock remains at a logic level high for 50 ns, then after the first N clock pulses have been generated, the first binary search circuit 204A will have determined that a current having a magnitude of approximately 8 µamps will be needed to cause $V_{CAP1}$ to be equal to $V_{REF}$. If instead, the clock pulse generated by the external clock remains at a logic level high for longer than 50 ns, then after the first N clock pulses have been generated, the first binary search circuit 204A will have determined that a current having a magnitude that is lower than 8 µamps will be needed to cause $V_{CAP1}$ to be equal to $V_{REF}$. Conversely, if the clock pulse generated by the external clock remains at a logic level high for fewer than 50 ns, then after the first N clock pulses have been generated, the first binary search circuit 204A will have determined that a current having a magnitude that is greater than 8 µamps will be needed to cause $V_{CAP1}$ to be equal to $V_{REF}$. Thus, the duration of the external clock cycle is related to the magnitude of current needed to cause $V_{CAP1}$ to be equal to $V_{REF}$. It follows, therefore, that by approximating the magnitude of current needed to cause $V_{CAP1}$ to be equal to $V_{REF}$, the duration of time for which the external clock pulse is at a logic level high can be derived, as described in further detail below.

The amount of current required to achieve $V_{CAP1}$ equal to $V_{REF}$, can, in some example applications be used to represent a range "$I_{RANGE}$" of currents to be supplied by the current sources. Hence, in some such example applications, the range of currents, "$I_{RANGE}$", supplied by the example first set of current sources 210A is to span from a minimum, "$I_{MIN}$", of zero to a maximum, "$I_{MAX}$", of 8 µamps. Regardless of the actual magnitude of $I_{RANGE}$, the current range $I_{RANGE}$ is divided into discrete quantization levels, and each discrete quantization level corresponds to a respective distinct combination of the values of the bits in the example first binary search register 206A of the example first binary search circuit 204A. Assuming, for example, that the first binary search register 206A is configured to store 8 bits, the first most significant bit, when set to a logic 1, can be used to represent $I_{MAX}/2$, the second most significant bit, when set to a logic 1, can be used to represent $I_{MAX}/4$, the third most significant bit, when set to a logic 1, can be used to represent $I_{MAX}/8$, etc. In some such examples, the first set of current sources 210A are also sized based on the range, $I_{RANGE}$, such that the respective one of the first set of current sources 210A controlled by the first most significant bit (e.g., the first largest/highest current source), when activated, supplies a current equal to $I_{MAX}/2$, the respective one of the first set of current sources 206 controlled by the second most significant bit (the second largest current source), when activated, supplies a current equal to $I_{MAX}/4$, the respective one of the first set of current sources 206 controlled by the third most significant bit (the third largest current source), when activated, supplies a current equal to $I_{MAX}/8$, etc. Thus, in the example application described above in which $I_{MAX}$ is 8 µamps, the largest of the first set of current sources 210A is sized to supply 4 µAmps and the smallest of the first set of current sources is sized to supply 32 nanoAmps (nA).

Referring still to FIG. 2, as described above, in response to (or before) the first of the N pulses generated by the example external clock 106, the example first binary search circuit 204A sets the most significant bit equal to a logic 1 and sets the remaining bits equal to a logic 0 thereby activating only the largest of the example first set of current sources 210A. In addition, in response to the first of the N pulses generated by the external clock 106, the example first switch 218A couples the example first capacitor 212A to the first set of current sources 210A on the rising edge of the first of the N pulses and decouples the first capacitor 212A from the first set of current sources 210A on the falling edge of the first of the N pulses. Thus, for example, when the external clock 106 is operating at a 50% duty cycle, the first switch 218A will remain closed for an amount of time equal to one-half of the duration of the clock cycle of the external clock 106. If the first capacitor voltage, $V_{CAP1}$, resulting from the current supplied by the largest of the first set of current sources 210A while the switch is closed (e.g., while the clock pulse is at a logic level 1) exceeds the reference voltage $V_{REF}$, then the amount of current generated by the largest of the set of current sources 206 exceeded the amount of current needed to cause $V_{CAP1}$ to be equal to $V_{REF}$. As a result, the example first binary search circuit 204A causes the first most significant bit of the first binary search register 206A to reset to a logic level 0, thereby deactivating the largest of the current sources 210A during subsequent ones of the first set of N clock pulses. Otherwise, the first binary search circuit 204A causes the first most significant bit of the first binary search register 206A to be set (e.g., remain set at a logic 1), thereby keeping the largest of the first set of current sources 210A activated during subsequent ones of the first set of N clock pulses. A short duration of time after the first switch 218A causes the first set of current sources 210A to be decoupled from the first capacitor 212A, the first capacitor 208 completely discharges causing $V_{CAP1}$ to be equal to zero. Before the first capacitor 208 begins discharging, the first comparator 210 compares $V_{REF}$ to $V_{CAP1}$ and the result of the comparison is supplied by the output of the first comparator 214A to the first binary search circuit 204A.

In response to the second pulse generated by the example external clock 106 and assuming the first capacitor voltage $V_{CAP1}$ was determined to be smaller than the reference voltage $V_{REF}$ such that the first most significant bit is set to a logic 1, the example first binary search circuit 204A sets the second most significant bit of the example first binary search register 206A equal to a logic 1 and sets the remaining bits of the register 206A equal to a logic 0 thereby activating both the first largest and the second largest of the example first set of current sources 210A but keeping others of the first set of current sources 210A deactivated. In addition, in response to the second pulse generated by the external clock 106, the example first switch 218A couples the example first capacitor 208 to the first set of current sources 210A on the rising edge of the pulse and decouples the first capacitor 212A from the first set of current sources 210A on the falling edge of the pulse. As such, current flows from the first largest of the first set of current sources 210A and from the second largest of the first set of current sources 210A to the example first capacitor 212A when the first current sources 206 are coupled to the first capacitor 208. If the first capacitor voltage $V_{CAP1}$ resulting from the current supplied by the first largest of the first set of current sources 206 and the second largest of the first set of current sources 206 does not exceed the reference voltage $V_{REF}$, then the amount of current supplied to the first capacitor 208 is less than the amount of current needed to achieve $V_{CAP1}$ equal to $V_{REF}$. As a result, the first binary search circuit 204A causes the second most significant bit of the first binary search register 206A to remain set at a logic 1 so that the second largest of the first set of current sources 206 remains activated. Otherwise, the first binary search circuit 204A causes the second most significant bit of the first binary search register 206A to be reset at a logic 0 to thereby deactivate the second largest of the first set of current sources 210A. The second most significant bit remains at this level for the remainder of the N clock pulses. Recall that the first most significant bit remains at the level at which it was set (or reset) following the first clock pulse for the remainder of the N clock pulses. Again, when the first switch 218A decouples the first capacitor 212A from the first set of current sources 210A, after a short duration of time, the first capacitor 212A begins discharging causing $V_{CAP1}$ to equal zero. Note that, during the short duration of time before the first capacitor 212A begins discharging, the first comparator 214A determines whether $V_{CAP1}$ exceeds $V_{REF}$.

The example first current approximation circuit 202A continues to operate in the manner described for each of the remaining N clock pulses such that: 1) before each of the N clock pulses is set to a logic high, a corresponding one of the bits in the example first binary search register 206A is set to a logic 1 causing a corresponding one of the example first set of current sources 210A to activate, and 2) the same bit is retained at a logic 1 or reset to a logic 0 based on the comparison between $V_{CAP1}$ and $V_{REF}$ performed after the example first capacitor 212A has been charged for an amount of time corresponding to the duration of time that the external clock pulse was at a logic high. Thus, after a set of N clock pulses, the example first binary search register 206A associated with the example first binary search circuit 204A of the example first current approximation circuit 202A holds a first set of bits representing a first magnitude of current approximated during the first portion of the external clock cycle (e.g., the portion of the clock cycle when the external clock pulse is high). Further, the first magnitude of current approximated during the first portion of the external clock cycle is equal to an amount of current needed to achieve $V_{CAP1}=V_{REF}$. As described above, capacitor voltage $V_{CAP1}$ increases as an amount of time that a constant current is supplied to the first capacitor 212A increases. Additionally, due to the manner in which the first current approximation circuit 202A operates, the duration of time that the first set of current sources 210A is activated is equal to the duration of time that the clock pulse is at a logic level high. Thus, an increase in the duration of time that the clock pulse is at a logic level high results in an increase in the amount of time that the first set of current sources 210A supply current to the first capacitor 212A. As such, the amount of current needed to achieve $V_{CAP1}=V_{REF}$ is greater when the duration of time that the clock pulse is at a logic level high is shorter. Conversely, the amount of current needed to achieve $V_{CAP1}=V_{REF}$ is lower when the duration of time that the clock pulse is at a logic level high is longer.

As described above, the example frequency detector and oscillator circuit 110 includes an example second current approximation circuit 202B having the same design as the first current approximation circuit 202A except that the second current approximation circuit 202B includes an inverter 219 coupled to the output of the external clock 106 that is coupled to the second switch 212B. Thus, unlike the example first switch 212A which couples the first set of current sources 210A to the first capacitor 212A when the clock pulse is high and decouples the first set of current sources 210A from the first capacitor 212A when the clock pulse is low, the second switch 212B couples the example second set of current sources 210B to the example second capacitor 212B when the external clock pulse is low and decouples the second set of current sources 210B from the second capacitor 212B when the external clock pulse is high. The example second current approximation circuit 202B continues to operate in the manner described with respect to the first current approximation circuit 202A for each of the remaining N clock pulses such that: 1) before each of the N clock pulses is set to a logic low, a corresponding one of the bits in the example second binary search register 206B is set to a logic 1 causing a corresponding one of the set of example second set of current sources 210B to activate, and 2) the same bit is retained at a logic 1 or reset to a logic 0 based on the comparison between $V_{CAP2}$ and $V_{REF}$ performed after the example second capacitor 212B has been charged for an amount of time corresponding to the duration of time that the external clock pulse was at a logic low. Thus, after a set of N clock pulses, the second binary search register 206B associated with the example second binary search circuit 204B of the example second current approximation circuit 202B holds a second set of bits representing a second magnitude of current approximated during the second portion of the external clock cycle. Further, the second magnitude of current approximated during the second portion of the external clock cycle is equal to an amount of current needed to achieve $V_{CAP2}=V_{REF}$.

As described above, the second capacitor voltage $V_{CAP2}$ increases as an amount of time that a constant current is supplied to the example second capacitor 212B increases. Additionally, due to the manner in which the second current approximation circuit 202B operates, the duration of time that the second set of current sources 210B is activated is equal to the duration of time that the clock pulse is at a logic level low. Thus, an increase in the duration of time that the clock pulse is at a logic level low results in an increase in the amount of time that the second set of current sources 210B supply current to the second capacitor 212B. As such, the amount of current needed to achieve $V_{CAP2}=V_{REF}$ is greater when the duration of time that the clock pulse is at a logic level low is shorter. Conversely, the amount of current needed to achieve $V_{CAP2}=V_{REF}$ is lower when the duration of time that the clock pulse is at a logic level low is longer.

By using the example inverter 219 in the manner described, the example first current approximation circuit 202A operates during a first portion of the example external clock (when the external clock is at a logic level high) and the example second current approximation circuit 202B operates during a second portion of the external clock cycle (when the external clock is at a logic level low). Together, the duration of first portion of the clock cycle and the duration of the second portion of the clock cycle form the duration of the entire clock cycle. After a set of N clock pulses has elapsed, the external clock halts operation and the example frequency detector and oscillator circuit 110 begins operating as an internal oscillator. Upon entering this mode, the example first binary search register 206A associated with the example first binary search circuit 204A of the example first current approximation circuit 202A holds a first set of bits representing a first magnitude of current approximated during the first portion of the external clock cycle (when the clock pulse was high). Similarly, the example second binary search register 206B associated with the example second binary search circuit 204B of the example second current approximation circuit 202A holds a second set of bits representing a second magnitude of current approximated during the second portion of the external clock cycle (when the clock pulse was low). Further, as described above, the first magnitude of current represents the amount of current needed to achieve $V_{CAP1}=V_{REF}$ during the first portion of the external clock cycle and the second magnitude of current represents the amount of current needed to achieve $V_{CAP2}=V_{REF}$ during the second portion of the external clock cycle. Due to the manner in which the first magnitude of current was derived by the frequency detector and oscillator circuit 110, if a current having a magnitude equal to the first magnitude of current is supplied to the first capacitor 212A, the duration of time required for $V_{CAP1}$ to equal $V_{REF}$ is equal to the duration of time that the external clock pulse was high. Likewise, when a current having the second magnitude of current is supplied to the second capacitor 212B, the duration of time required for $V_{CAP2}$ to equal $V_{REF}$ is equal to the duration of time that the external clock pulse was low. Thus, the first and second durations, when combined, equal the duration of one clock cycle of the external clock.

In some examples, the first set of bits and the second set of bits are both supplied to an example current calculating circuit 220 that determines, for example, a third set of bits representing an average of the first and second magnitudes of approximated current. Thus, the third set of bits represents an average of the amount of current needed to achieve $V_{CAP1}=V_{CAP2}=V_{REF}$. Also, when a current having a magnitude equal to the average amount of current needed to achieve $V_{CAP1}=V_{CAP2}=V_{REF}$ is supplied to either the first or the second capacitor 212A, 212B, a third duration of time required for either of $V_{CAP1}$ or $V_{CAP2}$ in response to the average amount of current is equal to one half of the duration of one clock cycle of the external clock.

The third set of digital bits is supplied by the example current calculating circuit 220 to the first register 212A and to the second register 212B for use in generating an oscillating signal having the same frequency as the frequency of the example external clock 106 with a 50% duty cycle (as described further below). Note that, although the current calculating circuit 220 is described as generating an average of the first and second magnitudes of approximated current, the current calculating circuit 220 may instead be configured to perform any desired calculations to generate the third set of output bits.

When the example external clock 106 stops generating clock the first set of N clock pulses, the example first binary search circuit 204A enables the example S-R latch 222 of the example frequency detector and oscillator circuit 110 by sending a signal to the E input of the S-R latch 222. Additionally, the same signal is supplied by the binary search circuit 204A to the C input of the example multiplexing device 116, thereby causing the multiplexing device 116 to begin supplying the QZ output of the S-R latch 222 to the example SAR ADC 102 (see FIG. 1). When the S-R latch 222 becomes enabled, the QZ output of the S-R latch 222 is supplied to the first current approximation circuit 202A and the Q output of the S-R latch 222 is supplied to the second current approximation circuit 202B to begin controlling the first and second switches 218A, 218B, respectively, in the manner described below.

As illustrated in FIG. 2 and described above, the example S-R latch 222 includes an example first input "S" coupled to the output of the example first comparator 214A and an example second input "R" coupled to the output of the example second comparator 214B. In addition, the S-R latch 222 includes an example first output "QZ" coupled to control the example first switch 218A and an example second output "Q" coupled to control the example second switch 218B. Initially, the S-R latch 222 is in a reset condition in which "S=0," "R=1," "Q=0" and "QZ=1." When "QZ=1," the first switch 218A couples the example first set of current sources 210A to the example first capacitor 212A and when "Q=0," the second switch 218B decouples the example second set of current sources 210B from the example second capacitor 212B. As described above, the third set of bits representing an amount of current needed to achieve $V_{CAP1}=V_{REF}$ is stored in the example first binary search register 206A. As such the first set of current sources 210A are controlled by the example outputs 208A of the binary search circuit 204A to generate an amount of current needed to charge the first capacitor 218A to a voltage of $V_{CAP1}=V_{REF}$. As a result, when the first switch 218B couples the first set of current sources 210A to the first capacitor 212A (in response to QZ being equal to a logic level 1), the first set of current sources 210A cause $V_{CAP1}$ to charge to $V_{REF}$. Further, when the current is supplied to the first capacitor 212A, the duration of time needed to achieve $V_{CAP1}=V_{REF}$ is equal to one half of the clock cycle of the example external clock.

When the voltage, $V_{CAP1}$, across the example first capacitor 212A reaches $V_{REF}$, the output of the example first comparator 214A changes from a low to a high thereby causing the input "S" to the example S-R latch 222 to be a logic level 1. In response, the outputs of the S-R latch 222 flip such that Q=1 and QZ=0. As a result of the output flip, the first capacitor 212A is decoupled from the example first set of current sources 210A by the first switch 218A, and the example second switch 218B causes the example second set of current sources 210B to be coupled to the example second capacitor 212B. As described above, the third set of bits representing an amount of current needed to achieve $V_{CAP2}=V_{REF}$ is stored in the example binary search second register 206B. As such, the second set of current sources 210B are controlled by the output of the second binary search circuit 206B to generate an amount of current needed to charge the second capacitor 212B to a voltage of $V_{CAP2}=V_{REF}$. As a result, when the second switch 218B couples the second set of current sources 210B to the second capacitor 212B (in response to Q being equal to a logic level 1), the second set of current sources 210B cause $V_{CAP2}$ to charge to $V_{REF}$. Further, when the current is supplied to the second capacitor 212B, the duration of time needed to achieve $V_{CAP2}=V_{REF}$ is equal to one half of the clock cycle of the example external clock.

When the voltage, $V_{CAP2}$, across the example second capacitor 212B reaches $V_{REF}$, the output of the example second comparator 214B changes from a low to a high thereby causing the input "R" to the example S-R latch 222 to be a logic level 1. In response, the outputs of the S-R latch 222 flip such that Q=0 and QZ=1. As a result of the flip, the second capacitor 212B is decoupled from the example second set of current sources 210B by the example second switch 218B, and the example first switch 218A couples the example first set of current sources 210A to the example first capacitor 212A. Thereafter, the first current approximation circuit 202A again operates to charge the first capacitor 212A until $V_{CAP1}=V_{REF}$, and so on. Thus, as described above, the first output QZ of the S-R latch 222 is initially at a logic level high for a duration of time equal to one half of the clock cycle of the external clock and is subsequently low for a duration of time equal to one half of the clock cycle of the external clock 106. In this manner, the first output QZ of the S-R latch 222 oscillates at a frequency equal to the frequency at which the external clock 106 generated the first N clock pulses. In some example applications, the first output QZ of the S-R latch 222 is digitally buffered and used as an oscillator output signal. Because the second output Q of the S-R latch 222 also continues to oscillate between a logic level high and logic level low at the frequency of the external clock 106, the second output Q of the S-R latch 222 can additionally or alternatively be digitally buffered and used as the oscillator output signal.

The example S-R latch 222 becomes disabled after M oscillations have been generated at the output of the S-R latch 222, and the external clock 106 is enabled and begins generating a second set of N clock pulses. Thus, the example frequency detector and oscillator circuit 110 stops operating as an oscillator and again begins to operate as a frequency detector in the manner described above with respect to the second set of N clock pulses.

Figure 3:
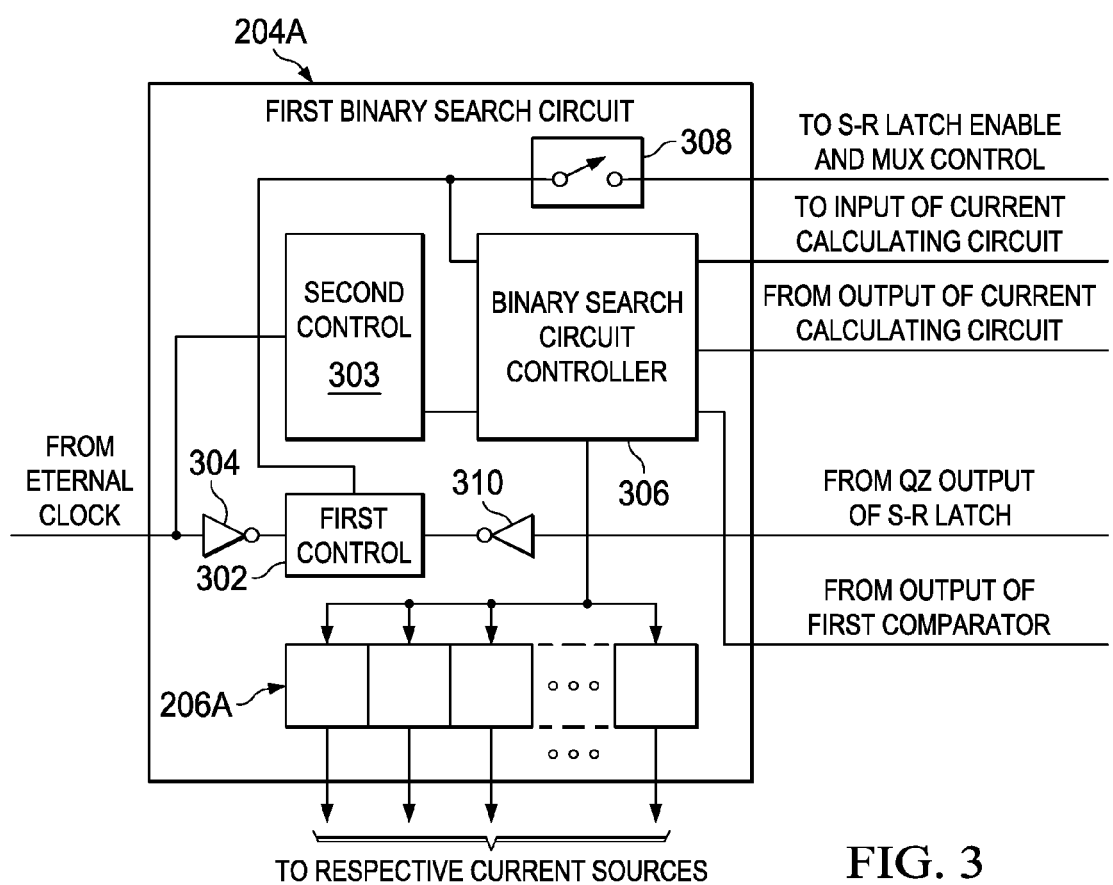
FIG. 3 is a schematic diagram of an example implementation of an example first binary search circuit included in the frequency detector and oscillator circuit illustrated in FIG. 1 and FIG. 2.

FIG. 3 is a block diagram representative of an example implementation of the example first binary search circuit 204A of FIG. 2 and includes an example first counter 302 and an example second counter 303. The first counter 302 is coupled to receive an input from the example external clock 106 (see FIG. 1) via an example first inverter 304 and to receive an input from the QZ output of the S-R latch 222 via an example second inverter 310. An output of the first counter 302 is coupled to an example binary search circuit switch 308. The second counter 303 is coupled to receive an input signal from the output of the external clock 106 and is further coupled to the first binary search circuit controller 306. The first binary search circuit controller 306 is also coupled to the example first binary search register 206A (see also FIG. 2) and operates to change the bits stored in the first binary search register 206A in response to the comparisons made between $V_{CAP1}$ and $V_{REF}$ by the example first comparator 214A (see FIG. 2) in the manner described above.

In some examples, the example first binary search circuit controller 306 initializes a value (represented by "j") stored in the example second counter 303 by setting j equal to zero. Each time the falling edge of the clock pulse signal is detected by the second counter 303, the first binary search circuit controller 306 captures the output of the example first comparator 214A (see FIG. 2) for use in setting and/or resetting a respective bit of the binary search register 206A, as needed. Additionally, each time the falling edge of the clock pulse signal is detected, the value j stored in the example second counter 303 is incremented by one to thereby track the number of times that the output of the external clock was at a logic level high, as described in further detail below.

In some examples, the example first counter 302 tracks the number of clock pulses generated by the example external clock 106 for use in determining when the example frequency detector and oscillator circuit 110 is to stop operating in the frequency detection mode and to begin operating in the oscillator mode. In some such examples, the example counter 302 is configured to determine when the signal generated by the external clock 106 has pulsed high (during the first portion of the clock cycle) and has pulsed low (during the second portion of the clock cycle) a total of N times, wherein N represents the number of clock pulses during which the frequency detector and oscillator circuit 110 (see FIG. 1 and FIG. 2) is operating as a frequency detector. In some such examples, the first counter 302 is configured to make such a determination by incrementing a stored value (represented by "i") each time a falling edge of the inverted clock pulse signal supplied by the example first inverter 304 is detected. As the inverted clock pulse signal will fall from a high value to a low value at the end of the second portion of each clock cycle, the falling edge of the inverted clock pulse signal can be used as an indicator of when a complete clock cycle has completed. In some examples, the first counter 302 monitors the value of i and, when the value of i is less than a count of N (meaning that fewer than N clock cycles have been completed by the example external clock 106), the first counter 302 causes an example switch 308 coupled to the enable "E" input of the S-R latch 222 and coupled to the control "C" input of the multiplexing device 116 to remain in an open position such that the S-R latch 222 is not enabled and the multiplexing device 116 is configured to supply the external clock signal to the example SAR ADC 102 (see FIG. 1). Thus, when fewer than N clock cycles have been completed, the frequency detector and oscillator circuit 110 is operating in the frequency detecting mode.

In some examples, when the value i stored in the first counter 302, is equal to a count of N (meaning that N clock cycles have been completed), the first counter 302 causes the binary search circuit switch 308 to close thereby causing an enable signal to be supplied to the enable "E" input of the example S-R latch 222 and also causing a control signal to be supplied to the control "C" input of the example multiplexing device 116. When the enable signal is supplied to the S-R latch 222, the S-R latch 222 begins operating in response to the signals supplied by the example first comparator 214A and the example second comparator 214B to generate oscillating signals as described above. In addition, when the control signal is supplied to the multiplexing device 116, the multiplexing device 116 causes the oscillating signals to be supplied to the SAR ADC 102. Thus, after N clock cycles have completed, the frequency detector and oscillator circuit 110 begins operating as an oscillator. Before the oscillations begin, the counter sets the value i equal to zero.

In some examples, the QZ output of the example S-R latch 222 is input to the example first counter 302 via the example second inverter for use in counting the number of oscillating signals generated by the example frequency detector and oscillator circuit 110 when operating in the oscillator mode. In some such examples, the QZ output of the S-R latch 222, as described above, is supplied to the example second inverter 310 before being supplied to the first counter 302. Each time the first counter 302 detects a falling edge of a pulse supplied by the output of the second inverter 310, the value i is incremented by the first counter 302. As the input of the second inverter is coupled to the QZ output of the S-R latch 222, the first counter 302 will be incrementing each time the QZ output of the S-R latch 222 toggles from a logic level low to a logic level high which will occur each time the oscillating signal supplied by the S-R latch 222 has completed a full clock cycle. Thus, the first counter 302 is able to track the number of oscillating signals supplied by the S-R latch 222. The first counter 302 monitors the value of i and when the value of i is equal to M, thereby indicating that M pulses have been generated by the frequency detector and oscillator circuit 110, the first counter 302 causes the binary search circuit switch 308 to open thereby disabling the example S-R latch 222 and causing the example multiplexing device 116 to supply the example external clock signal to the SAR ADC 102. Additionally, the first counter resets the value of i to zero (e.g., i=0). In some examples, any of the multiplexing device 116, the SAR ADC 102, the frequency detector and oscillator circuit 110 may provide an input signal to the external clock 106 to thereby cause the external clock 106 to begin generating the next set of N clock pulses.

In addition to controlling when the output of the example first comparator 214A (see FIG. 2) is used to set/reset a respective bit of the example first binary search register 206A, the example first binary search circuit controller 306 also determines when the first set of bits representing the first magnitude of current approximated by the first current approximation circuit 202A (see FIG. 2) is to be supplied to the example current calculating circuit 220 (see FIG. 2). In some such examples, when the value of i stored by the first counter 302 reaches N, the first counter 302 sends a signal to the first binary search circuit controller 306. The first binary search circuit controller 306 responds to the signal by causing the first set of bits stored in the example binary search register 206A to be supplied to the input of the example current calculating circuit 220 (see FIG. 2). As described above, the first set of bits represent the first magnitude of current needed to achieve $V_{CAP1}=V_{REF}$ as approximated by the first current approximation circuit 202A during the first N clock pulses. Later, when the third set of bits are supplied by the current calculating circuit 220 to the first binary search circuit 204A, the first binary search circuit controller 306 causes the third set of bits to be stored in the first binary search register 206A. As described above, the third set of bits represent the average of 1) the first magnitude of current needed to achieve $V_{CAP1}=V_{REF}$, and 2) the second magnitude of current needed to achieve $V_{CAP2}=V_{REF}$. In some examples, the first binary search register 206A is coupled to the input of the current calculating circuit 220 and is coupled to the output of the current calculating circuit 220 to supply bits to (and receive bits from) the current calculating circuit 220 directly. In some examples, the first binary search register 206A receives bits from and supplies bits to the current calculating circuit 220 via the first binary search circuit controller 304.

In some examples, the example second binary search circuit 204B includes the same circuitry/logic included in the example first binary search circuit 204A except that the second binary search circuit 204B is not configured to enable the S-R latch 222 or control the multiplexing device 116. In some examples, the second binary search circuit 204B is configured to enable the S-R latch 222 and control the multiplexing device 116 instead of the first binary search circuit 204A. In some examples, the first binary search circuit 204A and the second binary search circuit 204B are implemented using a same binary search circuit. In some such examples, the binary search circuit includes the example first binary search register 206A and the second binary search register 206B that are each coupled to control the example first and second sets of current sources 110A, 110B, respectively. In some such examples, the binary search circuit controller 306 controls the bits stored in the first binary search register 206A and further controls the bits stored in the second binary search register 206B.

In addition to the example implementation shown in FIG. 3, the example binary search circuit 204A can use any number of methods/techniques to track the number of clock pulses generated by the external clock and to track the number of oscillation signals generated by the frequency detector and oscillator circuit 110. Regardless of the methods/techniques used to track the clock pulses and oscillation signals, the frequency detector and oscillator circuit 110 switches between operating as a frequency detector and operating as an oscillation device based on the number of clock pulses detected and/or the number of oscillation signals generated.

Figure 4A:
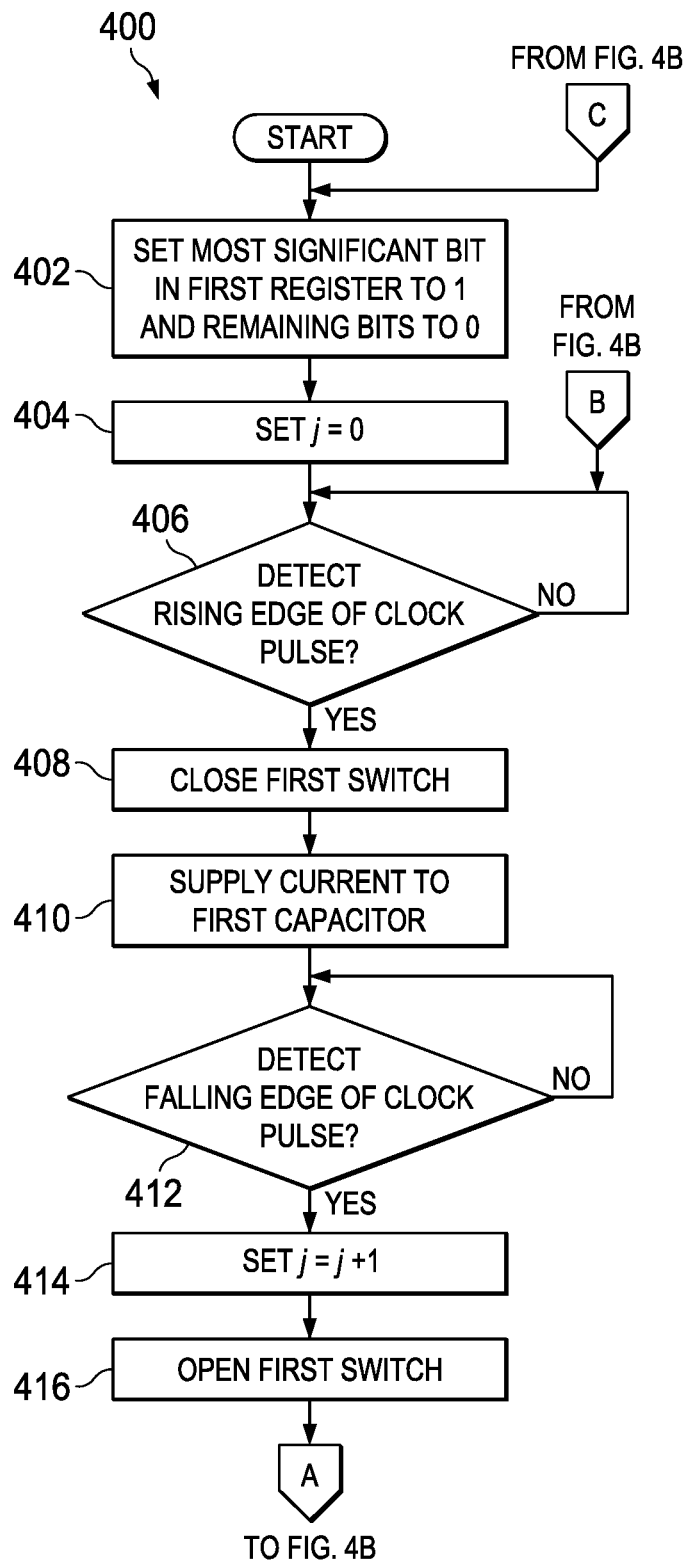
FIG. 4A and FIG. 4B collectively illustrate a flowchart representative of an example method which may be performed by an example first current approximation circuit and/or an example second current approximation circuit of FIG. 2 included in the frequency detector and oscillator circuit of FIG. 1 and FIG. 2.
Figure 4B:
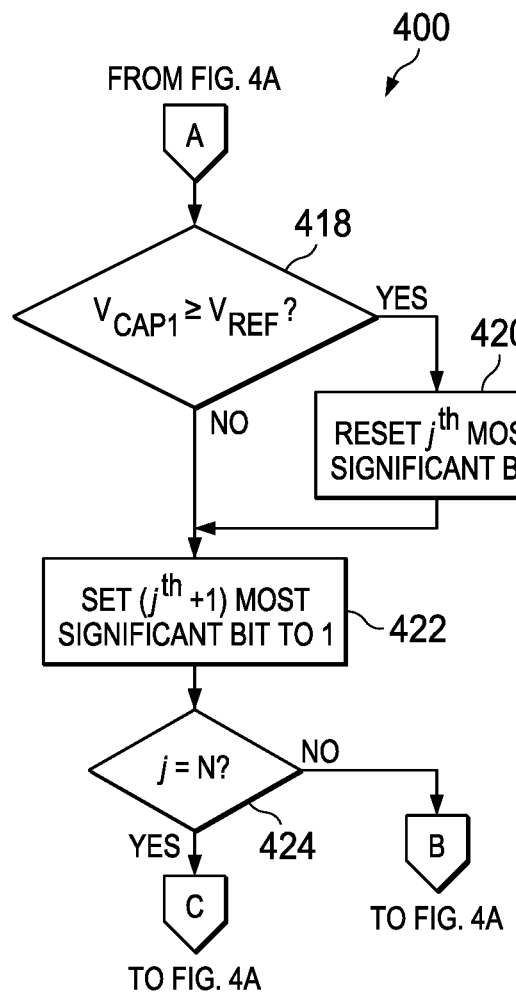

An example method 400 that may be performed by the example frequency detector and oscillator circuit 110 (see FIG. 1 and FIG. 2), is represented by the flowchart shown in FIG. 4A and FIG. 4B. With reference to FIG. 1, FIG. 2, and FIG. 3 and the associated written descriptions, the example method 400 begins at a block 402 at which the example first binary search circuit controller 306 sets a most significant bit stored in the first binary search register 206A to a value of 1 and sets the remaining bits equal to a value of zero. The example first counter sets a value "j" equal to zero. (See block 404). If a rising edge of a clock pulse is detected (see block 406), the first switch 218A closes (see block 408), thereby causing current to be supplied to the first capacitor 212A by the respective one of the example first set of current sources 210A corresponding to the most significant bit in the first binary search circuit register 206A (see block 410). If a rising edge of a clock pulse is not detected by the first switch, the first switch 218A remains open and the method returns to block 406.

If a falling edge of the clock pulse is then detected (see block 412), the value j stored in the second counter 303 is incremented by one (e.g., j=j+1) (see block 414). Additionally, the first switch opens (block 416) thereby halting the supply of current to the first capacitor 212A. If a falling edge of the clock pulse is not detected (see block 412), the method returns to the block 412 until a falling edge of the clock pulse is detected. As illustrated by the connection point A on FIG. 4A and FIG. 4B, after the first switch 218A opens, the first comparator 214A determines whether the voltage, $V_{CAP1}$, across the first capacitor 212A is greater than the reference voltage, $V_{REF}$ (see block 418). If $V_{CAP1}$ is greater than $V_{REF}$, then the first of the first set of current sources 210A supplied more current than the amount of current needed to achieve $V_{CAP1}=V_{REF}$, while the first switch 218A was closed. As a result, the example first binary search circuit controller 306 resets the $j^{th}$ most significant bit of the first binary search register 206A. By way of example, after the first time that a falling edge of the clock pulse is detected, j is equal to 1 such that the $1^{st}$ most significant bit of the first binary search register is reset from a value of 1 (a logic high) to a value of 0 (a logic low). If $V_{CAP1}$ is not greater than $V_{REF}$, then the respective ones of the first set of current sources 210A that are activated supplied less current than the amount of current needed to achieve $V_{CAP1}=V_{REF}$, while the first switch was closed. As a result, the first binary search circuit controller 306 does not reset the $j^{th}$ most significant bit to a logic level low (e.g., 0) but instead leaves the bit set to a logic level high (e.g., 1). In addition, the first binary search circuit controller 306 sets the bit of the first binary search register 206A corresponding to the ($j^{th}$+1) most significant bit to a logic level high (e.g., 1) (see block 422). The first binary search circuit controller 306 also determines whether the value of j is equal to N. If the first binary search circuit controller 306 determines j is not equal to N, the method returns to the block 406 (shown on FIG. 4A as indicated by the connection point B) and blocks subsequent thereto as described above. If the first binary search circuit controller 306 determines j is equal to N, the method returns to the block 402 (as indicated by the connection point C) and blocks subsequent thereto as described above. Thus, the first current approximation circuit 202A continues to set and reset the bits of the first binary search register 206A based on comparisons between $V_{CAP1}$ and $V_{REF}$ each time a falling edge of a clock pulse is detected. In this manner, after a first set of N clock pulses, the bits of the first binary search register 206A have been set and/or reset and together form a binary number that represents an approximation of a first magnitude of current to be generated during a first portion of the external clock cycle (e.g., when the clock pulse is high) to achieve $V_{CAP1}=V_{REF}$. Further, after the first set of N clock pulses have been detected and the first magnitude of current has been approximated, the method is later repeated based on a second set of N clock pulses. Thus, if the frequency of the external clock changes between a first set of N clock pulses and a second set of N clock pulses, the first magnitude of current approximated based on the first set of N clock pulses will be different than the first magnitude of current approximated based on the second set of N clock pulses. In this manner, the frequency at which the external clock is generating pulses can change to a new frequency without adversely impacting the ability of the frequency detector and oscillator circuit 110 to accurately detect the new frequency.

The method illustrated in and described with reference to FIG. 4A and FIG. 4B is also performed by the second current approximation circuit with minor changes. By way of example, the method 400 performed by the first current approximation circuit is performed in a manner that permits the approximation of the first magnitude of current needed to achieve $V_{CAP1}=V_{REF}$ during a first portion of the external clock cycle (e.g., when the clock pulse is high). In contrast, the method 400 performed by the second current approximation circuit is performed in a manner that permits the approximation of the second magnitude of current needed to achieve $V_{CAP2}=V_{REF}$ during a second portion of the external clock cycle (e.g., when the clock pulse is low). As such, the second current approximation circuit operates during the second portion of the external clock cycle (e.g., instead of detecting the rising edge of the clock pulse as described with respect to the block 406, the second counter 303 implemented in the second binary search circuit 204B detects the falling edge of the clock pulse). Likewise, instead of detecting the falling edge of the clock pulse as described with respect to the block 412, the second counter implemented in the second binary search circuit 204B detects the rising edge of the clock pulse).

It is noted that when the external clock 106 stops operating after the Nth clock pulse, there will be not be a rising edge of a next clock pulse when the second current approximation circuit 202B is operating as the external clock will simply stop operating. In such examples, the method 400 when performed by the second current approximation circuit 402B may include monitoring an output of the external clock 106 that indicates whether the external clock 106 is operational or has ceased operating. In some such examples, after the second switch 218B has been closed and the second set of current sources 210B have supplied current to the second capacitor 212B (at the blocks 408 and 410), at the block 412 the method 400 (when performed by the second current approximation circuit 402B) can include both 1) determining the operational status of the external clock 106, and 2) determining whether a rising edge of the clock pulse has been detected. In some such examples if either event is detected, then the method continues at the block 414.

Figure 5:
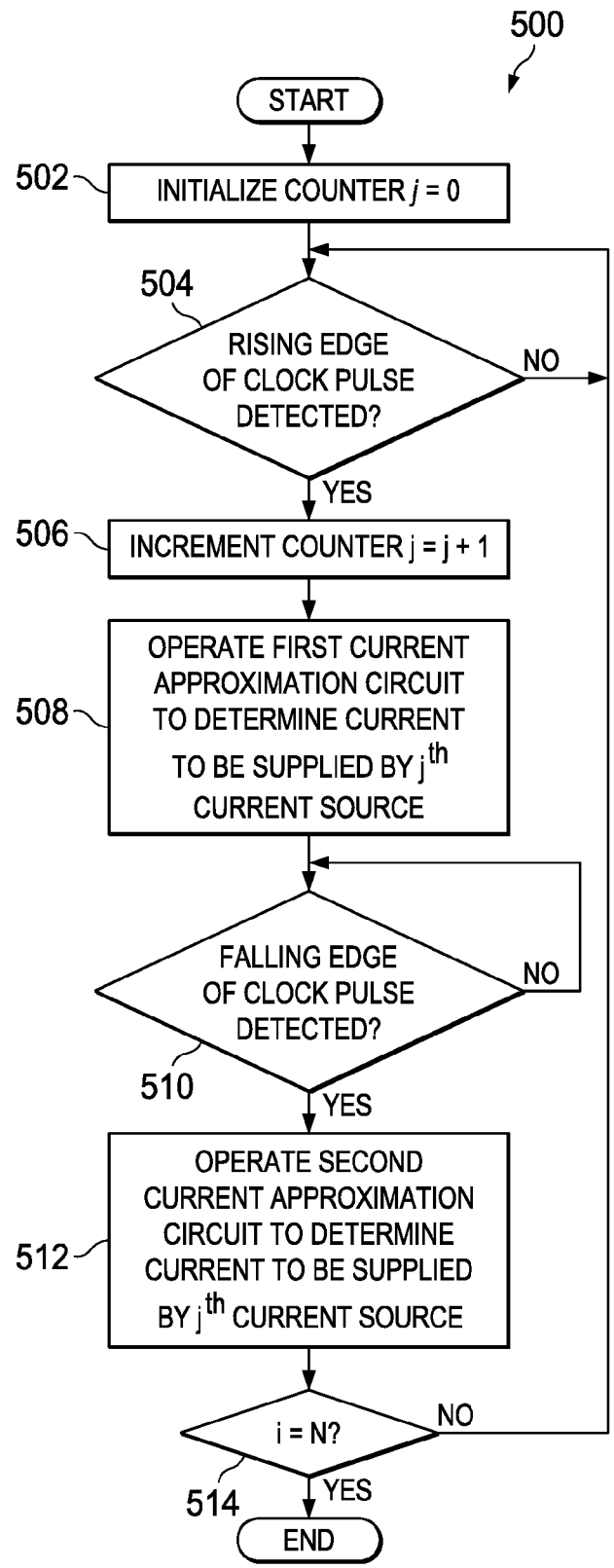
FIG. 5 is a flowchart representative of an example method which may be performed by the frequency detector and oscillator circuit of FIG. 1 and FIG. 2 to detect a frequency at which an example external clock is operating.

An example method 500 that may be performed by the example frequency detector and oscillator circuit 110 (see FIG. 1 and FIG. 2), when operating as a frequency detector is represented by the flowchart shown in FIG. 5. With reference to FIG. 1, FIG. 2, and FIG. 3 and associated written descriptions, the example method 500 begins at a block 502 at which the example first current approximation circuit and/or the second current approximation circuit 202A, 202B initializes a value, j, stored in the first counter by setting the value j equal to a logic level low (e.g., 0). Next, the first current approximation circuit and/or the second current approximation circuit 202A, 202B determines whether a rising edge of a clock signal supplied by the external clock 106 has been detected (see block 504). If the rising edge is not detected, the first current approximation circuit 202A and/or the second current approximation circuit 202B continues to return to the block 504 until the rising edge of the clock pulse is detected. If the rising edge is detected, the first current approximation circuit 202A and/or the second current approximation circuit 202B causes the value of j stored in the second counter to be incremented by one (e.g., j=j+1) (see block 506). Additionally, the first current approximation circuit 202A operates in the manner described above with respect to FIG. 2 and FIGS. 4A and 4B to determine a particular bit of a digital word representing a first current quantization level (see block 508). The determined bit may correspond to the "$j^{th}$" most significant bit in the example first binary search register 212A of the first current approximation circuit 202A (e.g., when one clock pulse has been detected, the value of j is equal to 1 and the $1^{st}$ (e.g., largest) bit of the digital word representing the quantization level is approximated. The first current quantization level may correspond to a combination of bits (forming a digital word) in the example binary search circuit register 212A that approximates the amount of current needed to charge the first capacitor 212A to a predetermined voltage ($V_{REF}$) during a time period corresponding to the active high portion of the external clock signal (e.g., the portion of the clock signal equal to a high logic value).

Next, the first current approximation circuit 202A and/or the second current approximation circuit 202B determines whether a falling edge of the clock pulse has been detected (see block 510). If the falling edge is not detected, the first current approximation circuit 202A and/or the second current approximation circuit 202B continues to return to the block 510 until the falling edge of the clock pulse is detected. If the falling edge is detected, the second current approximation circuit 202B operates in the manner described above with respect to the operation of the second successive operation circuit 202B to determine a particular bit of a current quantization level (see block 512). Here, the determined bit may correspond to the "$j^{th}$" most significant bit in the second binary search register 212B of the second current approximation circuit 212B (e.g., when one clock pules has been detected, the value of j is equal to 1 and the $1^{st}$ (e.g., largest) bit of the quantization level is approximated. The second current quantization level may correspond to a combination of bits in the example second binary search circuit register 206B that approximates the amount of current needed to charge the second capacitor 212B to a predetermined voltage ($V_{REF}$) during a time period corresponding to the active low portion of the clock signal (e.g., the portion of the clock signal equal to a low logic value).

Next, the first current approximation circuit 202A and/or the second current approximation circuit 202B determines whether j=N. If j=N, the frequency detector and oscillator circuit 110 stops operating as a frequency detector and the frequency detection method ends. If j is not equal to N, the method returns to the block 504 at which the first current approximation circuit 202A and/or the second current approximation circuit 202B determines whether a rising edge of a clock pulse has been detected (as described above), and blocks subsequent thereto.

Figure 6A:
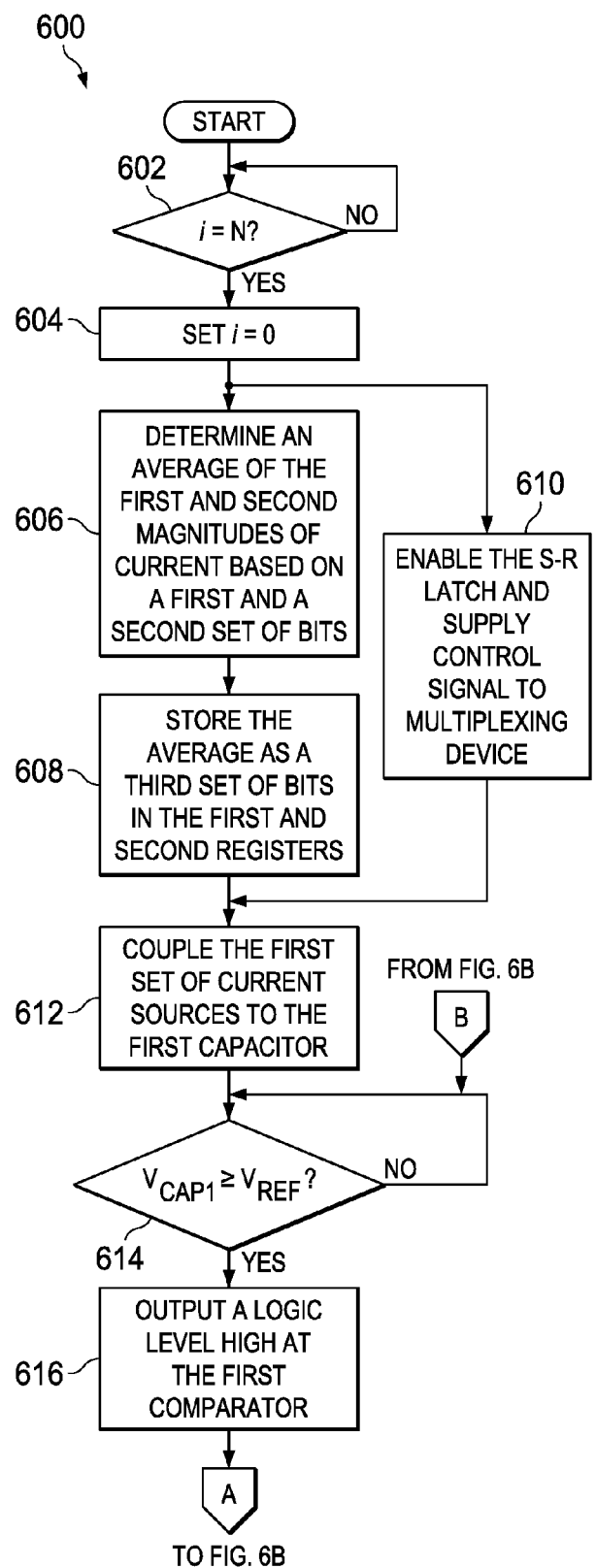
FIG. 6A and FIG. 6B collectively illustrate a flowchart representative of an example method which may be performed by the frequency detector and oscillator circuit of FIG. 2 to generate an oscillator signal at a detected frequency.
Figure 6B:
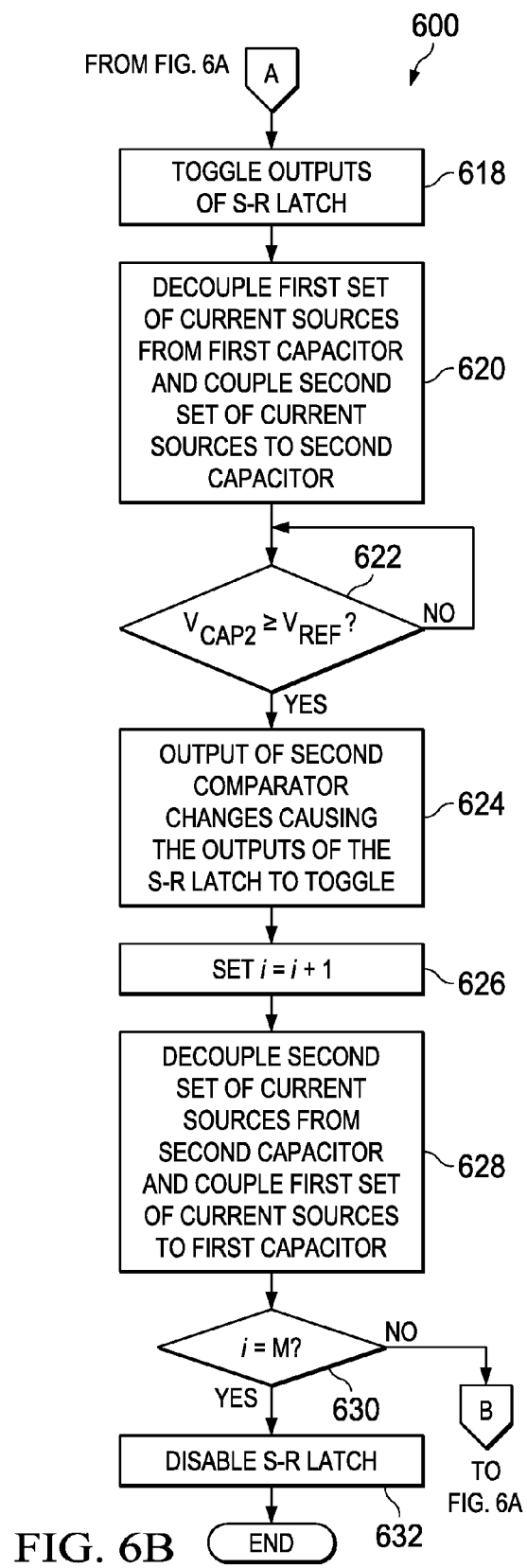

An example method 600 that may be performed by the example frequency detector and oscillator circuit 110 (see FIG. 1 and FIG. 2), when operating as an oscillator is represented by the flowchart shown in FIG. 6A and FIG. 6B. With reference to FIG. 1, FIG. 2, and FIG. 3 and associated written descriptions, the example method 600 begins at a block 602 at which the example first current approximation circuit 202A and/or the second current approximation circuit 202B determines whether a value "i" stored in the first counter 302 is equal to N. As described above with respect to FIG. 3, clock pulses are supplied by the external clock 106 to the first counter 302 via a first inverter 304 and the first counter 302 is configured to increment i by a value of 1 (e.g., i=i+1) each time the falling edge of the inverted clock pulse is detected. As further described above, the falling edge of the inverted clock pulse will be detected after each clock cycle of the external clock is completed (e.g. each time both the first and second portions of the clock cycle have occurred). As such, upon determining that i is equal to N (see block 602), a total of N clock cycles have occurred and a first binary value representing the first magnitude of current needed to achieve $V_{CAP1}=V_{REF}$ has been stored in the first binary register 206A and a second binary value representing the second magnitude of current needed to achieve $V_{CAP2}=V_{REF}$ has been stored in the second binary register 206B, as a result of the methods described with respect to FIG. 4A, FIG. 4B and FIG. 5. Next, the first current approximation circuit 202A and/or the second current approximation circuit 202B resets the value stored as i in the first counter to zero (e.g., i=0) (see block 604). Next, the current calculating circuit 220 determines an average of the first and second magnitudes of current using the first and the second sets of bits (block 606). In some examples, determining the average of the first and second magnitudes of current includes transmission of the first set of bits from the first current approximation circuit 202A to the current calculating circuit 220 and transmission of the second set of bits from the second current approximation circuit 202B to the current calculating circuit 220. Next, the average of the first and second magnitudes is supplied as a third set of bits by the current calculating circuit 220 to the first binary search register 206A and the second binary search register 206B and stored therein (see 608). While the average of the first and second magnitudes of current is being calculated and stored, the first current approximation circuit 202A supplies a signal to the enable "E" input of the S-R latch 222 thereby enabling the S-R latch 222 (see block 610). When the S-R latch 222 is enabled, the S-R latch output "QZ" is set to a logic level high (e.g., 1) and the S-R latch 222 output "Q" is set to a logic level low (e.g., 0). In addition to enabling the S-R latch 222, the first current approximation circuit 202A transmits a signal to the control "C" input of the example multiplexing device 116, thereby causing the multiplexing device 116 to begin supplying the QZ output of the S-R latch 222 to the SAR ADC 102 instead of supplying the external clock signal (see block 610).

In some examples, when the S-R latch 222 is enabled, the QZ output is initially set to a logic level high, thereby causing the first switch 218A to couple the first set of current sources 210A to the first capacitor 212A (see block 612). Note that due to the storage of the third set of bits in the first binary search register 206A (see block 608), coupling the first set of current sources 210A to the first capacitor 212A causes a current equal to the average of 1) the first magnitude of current approximated during the first N clock pulses and 2) the second magnitude of current approximated during the first N clock pulses to be supplied to the first capacitor 212A.

The example first comparator determines whether $V_{CAP1}$ is greater than or equal to $V_{REF}$ (see block 614). If not, the first comparator continues to test for the condition $V_{CAP1} \geq V_{REF}$. Note that until the condition, $V_{CAP1} \geq V_{REF}$, is met, the output QZ of the S-R latch 222 is at a logic level high and is being supplied via the multiplexing device 116 to the SAR ADC 102. Further, as described above, the amount of time needed to achieve $V_{CAP1} \geq V_{REF}$ when supplying the average amount of current calculated by the current calculating circuit 220 to the first capacitor 212A will equal one half of the clock cycle of the external clock 106 based on the first N clock pulses generated by the external clock 106. Thus, the output QZ of the S-R latch 222 will remain at a logic level high for an amount of time equal to one half of the duration of the external clock cycle.

When the condition $V_{CAP1} \geq V_{REF}$, is met (as determined at the block 614), a logic level high (e.g., 1) is supplied at the output of the first comparator 214A. As indicated by the connection point A, the flowchart illustrating the method 600 continues on FIG. 6B. Due to the logic level high at the output of the first comparator 214A, the outputs QZ and Q of the S-R latch 222 toggle causing the QZ output of the S-R latch 222 to be set at a logic level low and the output Q of the S-R latch 222 to be set at a logic level high (see block 618). When the outputs of the S-R latch 222 toggle, in the manner described, the example first switch 218A decouples the example first set of current sources 210A from the first capacitor 212A (see block 620). Additionally, when the outputs of the S-R latch 222 toggle, such that Q goes from a logic level low to a logic level high, the example second switch 218B couples the example second set of current sources 210B to the second capacitor 212B (see also block 620). Note that due to the storage of the third set of bits in the second binary search register 206B (as described with reference to block 608), coupling the second set of current sources 210B to the second capacitor 212B causes a current equal to the average of 1) the first magnitude of current approximated during the first N clock pulses, and 2) the second magnitude of current approximated during the first N clock pulses to be supplied to the second capacitor 212B. Further, as described above, when supplying the average amount of current (as calculated by the current calculating circuit 220) to the second capacitor 212B, the amount of time needed to achieve $V_{CAP2} = V_{REF}$, will be equal one half of the clock cycle of the external clock 106.

The example second comparator 214B determines whether $V_{CAP2}$ is greater than or equal to $V_{REF}$ (see block 622). If not, the second comparator 214B continues to test for the condition $V_{CAP2} \geq V_{REF}$. Note that until the condition, $V_{CAP2} \geq V_{REF}$, is met, the output QZ of the S-R latch 222 is at a logic level low and is being supplied via the multiplexing device 116 to the SAR ADC 102.

When the condition, $V_{CAP2} \geq V_{REF}$, is met (as determined at the block 622), the output of the second comparator 214B changes to a logic level high thereby supplying a logic level high to the R input of the S-R latch 222. In response, the outputs QZ and Q of the S-R latch 222 toggle causing the QZ output of the S-R latch 222 to be set at a logic level high and the output Q of the S-R latch 222 to be set at a logic level low (see block 624). As described above, the amount of time needed to achieve $V_{CAP2} \geq V_{REF}$ will equal one half the duration of the external clock cycle. Thus, the QZ output of the S-R latch 222 will have remained at a logic level low for an amount of time equal to one half the duration of the external clock cycle before the S-R latch 222 toggle occurs causing the QZ output to produce a logic level high.

In addition to causing the outputs of the S-R latch 222 to toggle, when the condition, $V_{CAP1} \geq V_{REF}$, is met (as determined at the block 622), the first counter 302 will detect a falling edge when monitoring the inverted signal supplied by the QZ output of the S-R latch 222. In response to the falling edge, the example first counter 302 increments the stored value of i such that (i=i+1) (see block 626). In this manner, the first counter 302 is tracking the number of oscillation signals generated by the S-R latch 222 as described with respect to FIG. 3.

The toggling of the QZ output and the Q output of the S-R latch (see block 624) also causes the second switch 218B to decouple the second set of current sources 210B from the second capacitor 212B and causes the first switch 218A to couple the first set of current sources 210A to the first capacitor 212A (see block 628). Further, the first counter 302 tests to determine whether the value of i stored in the first counter 302 is equal to M (see block 630). If not, the method returns to the block 614 (see FIG. 6A) (as indicated by the connection point B) and the blocks subsequent thereto.

If instead the value of i is determined to be equal to M (see block 630), the first counter 302 causes the binary search circuit switch 308 to open thereby disabling the S-R latch 222, and causing the multiplexing device 116 to supply the external clock signal to the SAR ADC 102 (see block 632). Thus, the frequency detector and oscillator circuit 110 stops operating as an oscillation device and the method by which the frequency detector and oscillator circuit 110 generates oscillating signals ends.

As will be understood, the method 600 illustrated in FIG. 6A and FIG. 6B provides an example method of operating the example frequency detector and oscillator circuit 110 of FIG. 1 and FIG. 2. Any of a variety of other methods could be used instead of or in addition to the example method 600. Further, the example method 600 can be modified in a variety ways to achieve the frequency detection functionality and oscillation functionality described herein. For example, any of the output of the first comparator, the output of the second comparator, the QZ output of the S-R latch 222, the Q output of the S-R latch 222 and the external clock signal can be used in any number of ways to track the number "N" of clock pulses generated by the external clock and/or the number "M" of oscillating signals generated by the frequency detector and oscillator circuit 110. Further, the order in which the operations described with respect to the example method 600 are performed are exemplary only. The operations can be performed in any number of orders different than the order of operations illustrated in FIG. 6A and FIG. 6B to achieve the desired frequency detection and oscillating signal generation. Additionally, although the example operations illustrated with reference to the blocks 602, 606, and 608 of FIG. 6A are described as being performed when the example frequency detector and oscillator circuit 110 is operating in the oscillator mode, such operations can be considered as being performed as part of either the frequency detection mode and/or the oscillator mode.

Frequency detector and oscillator circuits 110 configured in the manner disclosed above provide many benefits. For example, the frequency detector and oscillator circuit 110 described herein detects the frequency of a set of N clock pulses/cycles generated by an external clock and generates any additionally needed clock cycles/clock pulses at the detected frequency. To overcome the issues described above with respect to the prior art, the frequency detector and oscillator circuit 110 operates in a first mode in which a successive approximation technique is used to detect the frequency of the external clock during the generation of the first N cycles. Additionally, the frequency detector and oscillator circuit 110 operates in a second mode to generate a set of M oscillating signals thereby ensuring that the oscillating signals and the external clock pulses are synchronized. Thus, there is no need for an additional external clock to generate additional cycles. As such, successive approximation ADCs having a standard legacy interface are supported. Further, there is no need to provide a way to trim the oscillating signals supplied by the frequency detector and oscillator circuit 110 such that pin count is reduced and successive approximation ADCs having a legacy interface are supported. In addition, the chip area is reduced. Further, the frequency of the external clock can be changed without adversely affecting the operation of the device due to the usage of on-the-fly frequency detection of the external clock. Moreover various circuit elements of the internal oscillator are used to perform both the frequency detection and to supply the oscillating signals. Such circuit elements include the current sources and the capacitor shown in FIGS. 2 and 3. This ensures the accuracy of the frequency identified by the frequency detector and oscillator circuit 110 is limited only by the quantization accuracy of the successive approximation technique used by the frequency detector and oscillator circuit 110.

As described above, the first current approximation circuit 202A approximates the first magnitude of current needed to achieve $V_{CAP1}=V_{REF}$ when the external clock pulse is at a logic level high and the second current approximation circuit 202B signal approximates the second magnitude of current needed to achieve $V_{CAP2}=V_{REF}$ when the external clock pulse is at a logic level low. To achieve an oscillating signal having the same frequency as the external clock but at a 50% duty cycle, the current calculating circuit 220 determines the average of the first magnitude of current and the second magnitude of current for use in generating the oscillating signals. Another technique that can be used includes installing an internal clock divider in the frequency detector and oscillator circuit 110 to divide the external clock pulse by two. However, using an internal clock divider in this manner results in an external clock count of N/2 instead of N which, in turn negatively impacts the quantization level/accuracy. If however, N is a large enough value, then even N/2 results in an acceptable quantization accuracy. As such, if the value of N is large enough, an internal clock divider may be used in the frequency detector and oscillator circuit 110 of FIG. 1 and FIG. 2.

In some examples (and as illustrated in FIG. 4B, FIG. 6A, and FIG. 6B) the example first comparator 214A may be configured to determine whether $V_{CAP1}$ is greater than or equal ($\geq$) to $V_{REF}$. Likewise, the example second comparator 214B may be configured to determine whether $V_{CAP2}$ is greater than or equal ($\geq$) $V_{REF}$. In some such examples, when the frequency detector and oscillator circuit 110 is operating as a frequency detector, the first binary search circuit 204A can be configured to deactivate a corresponding one of the example first set of current sources 110A (by setting the corresponding bit of the binary search register 206A equal to zero) when the first comparator 214A determines that $V_{CAP1}$ is greater than or equal to $V_{REF}$ and to otherwise keep the respective current source activated. Likewise, the second binary search circuit 204B can be configured to deactivate a corresponding one of the example second set of current sources 110A when the second comparator 214A determines that $V_{CAP2}$ is greater than or equal to $V_{REF}$ and to otherwise keep the unique current source activated.

In some examples, the example first comparator 214A may be configured to determine whether $V_{CAP1}$ is greater $V_{REF}$. Likewise, the example second comparator 214B may be configured to determine whether $V_{CAP2}$ is greater than $V_{REF}$. In some such examples, when the frequency detector and oscillator circuit 110 is operating as a frequency detector, the first binary search circuit 204A can be configured to deactivate a unique one of the example first set of current sources 110A (by setting the corresponding bit of the binary search register 206A equal to zero) when the first comparator 214A determines that $V_{CAP1}$ is greater than $V_{REF}$ and to otherwise keep the current source activated. Likewise, the second binary search circuit 204B can be configured to deactivate a unique one of the example second set of current sources 110A when the second comparator 214A determines that $V_{CAP2}$ is greater than $V_{REF}$ and to otherwise vkeep the current source activated.

In some examples, the techniques of this disclosure may include a clock divider to divide the frequency of the signal supplied by the external clock before the clock signal is supplied to the first current approximation circuit as well as the remainder of the integrated circuit such as the SAR ADC. In such examples, the number of pulses supplied by the clock divider to the first current approximation circuit is equal to N/2 and the duty cycle is 50%. As such, the frequency detector and oscillation circuit may be configured to omit the second current approximation circuit as current averaging to support external clocks not having a 50% duty cycle will be unnecessary and, thus, the first current approximation circuit will be sufficient to determine an amount of current needed to generate oscillating signals at the target frequency. Such examples techniques may be used when, for example, the external clock is operating at a frequency that is fast enough (as compared to the frequency at which the SAR ADC generates a digital output) to ensure that the operation of the SAR ADC won't be adversely affected.

In some examples, the techniques of this disclosure may include, receiving, via an external clock signal pin of an integrated circuit, an external clock signal; determining (or detecting), with the integrated circuit, a frequency of the external clock signal; generating, with the integrated circuit, an internal clock signal having the determined frequency; and applying, with the integrated circuit, the internal clock signal to a clock input of one or more analog and/or digital sub-circuits (e.g., an ADC) of the integrated circuit. In some examples, the techniques of this disclosure may apply the external clock signal to another clock input of the one or more analog and/or digital sub-circuits. In further examples, the techniques of this disclosure may further include storing, in the integrated circuit (e.g., a register), a value indicative of an amount of current needed to generate the internal clock signal at the determined frequency of the external clock signal, and generating the internal clock signal such that the internal clock signal has a frequency that is determined based on the stored value.

In still further examples, all or portions of the frequency detector and oscillator circuit disclosed herein may be implemented using portions of the SAR ADC (see FIG. 1). For example, the SAR ADC includes a successive approximation register that may be used to implement either or both of the binary search circuits 204A, 204B.

Although certain methods and apparatus have been described herein, other implementations are possible. The scope of coverage of this patent is not limited to the specific examples described herein. On the contrary, this patent covers all methods and apparatus fairly falling within the scope of this disclosure.

What is claimed is:
1. A frequency detector and oscillator circuit comprising:
a current approximation circuit coupled to an external clock operating at a target frequency, the current approximation circuit configured to determine a magnitude of a first current to charge a capacitor to reach a reference voltage during a set of clock cycles generated by the external clock, to generate an output current based on the magnitude of the first current, and to use the output current to produce a comparator output; and
a latching circuit coupled to receive the comparator output from the current approximation circuit, the latching circuit configured to generate oscillating signals at the target frequency based on the comparator output.

2. The frequency detector and oscillator circuit of claim 1, in which the current approximation circuit is a first current approximation circuit, the magnitude of the first current is a first magnitude, the output current is a first output current, the capacitor is a first capacitor, and the comparator output is a first comparator output, the frequency detector and oscillator circuit further including:
a second current approximation circuit coupled to the external clock, the second current approximation circuit configured to determine a second magnitude of a second current to charge a second capacitor to reach the reference voltage during the set of clock cycles generated by the external clock, to generate a second output current based on the second magnitude of the second current, and to use the second output current to produce a second comparator output, the latching circuit being coupled to receive the second comparator output from the second current approximation circuit, and the latching circuit being configured to generate the oscillating signals at the target frequency based on the first comparator output and the second comparator output.

3. The frequency detector and oscillator circuit defined in claim 2, in which the first current approximation circuit includes:
a first binary search circuit having a first binary search circuit input and a plurality of control outputs;
a plurality of current sources, each of the current sources having an input coupled to and controlled by a respective one of the control outputs, each of the current sources having a respective current source output, the current source outputs of the respective current sources being coupled together, and current supplied by the current source outputs charging the first capacitor to generate a first capacitor voltage; and
a first comparator having the first comparator output, a first comparator input coupled to the first capacitor, and a second comparator input coupled to a voltage source configured to generate the reference voltage, the first comparator configured to compare the first capacitor voltage with the reference voltage, the first comparator output further being coupled to the first binary search circuit input.

4. The frequency detector and oscillator circuit defined in claim 3, further including a switch configured to couple the current source outputs of the current sources to the first capacitor for a threshold amount of time during each of the clock cycles generated by the external clock.

5. The frequency detector and oscillator circuit defined in claim 4, in which the switch is further configured to couple the current source outputs of the current sources to the first capacitor based on a latching circuit output of the latching circuit.

6. The frequency detector and oscillator circuit defined in claim 5, in which the latching circuit causes the switch to couple the current source outputs of the current sources to the first capacitor when the latching circuit output is at a first logic level and to decouple the current source outputs of the current sources from the first capacitor when the latching circuit output is at a second logic level.

7. The frequency detector and oscillator circuit defined in claim 5, the frequency detector and oscillator circuit further including a multiplexing device having a first input coupled to an output of the external clock, a second input coupled to the latching circuit output and an output coupled to an analog to digital converter, the multiplexing device causing a set of clock pulses to be supplied by the output of the external clock to the analog to digital converter for the set of clock cycles and causing the oscillating signals generated by the latching circuit to be supplied to the analog to digital converter after the set of clock cycles.

8. The frequency detector and oscillator circuit defined in claim 2, further including a current calculating circuit, the current calculating circuit being coupled to a third output of the first current approximation circuit and to a fourth output of the second current approximation circuit, the current calculating circuit configured to receive a first set of bits representing the first magnitude of the first current from the first current approximation circuit, to receive a second set of bits representing the second magnitude of the second current from the second current approximation circuit, and to generate a third set of bits based on the first set of bits and the second set of bits, the third set of bits representing a third magnitude of the output current.

9. The frequency detector and oscillator circuit defined in claim 8, in which the current calculating circuit supplies the third set of bits to the first binary search circuit of the first current approximation circuit and to a second binary search circuit of the second current approximation circuit, the first binary search circuit being configured to use the third set of bits to cause a first set of current sources in the first current approximation circuit to supply output current to the first capacitor until the first capacitor voltage reaches or exceeds the reference voltage, and the second binary search circuit being configured to use the third set of bits to cause a second set of current sources in the second current approximation circuit to supply the output current to a second capacitor in the second current approximation circuit until the second capacitor voltage reaches or exceeds the reference voltage.

10. The frequency detector and oscillation circuit of claim 9, in which a latching circuit output of the latching circuit output toggles from a first logic level to a second logic level when the first capacitor voltage reaches or exceeds the reference voltage and toggles from the second logic level to the first logic level when the second capacitor voltage reaches or exceeds the reference voltage.

11. The frequency detector and oscillation circuit of claim 8, in which the third magnitude of the output current determines the target frequency at which the latching circuit generates the oscillating signals.

12. A method to generate oscillating signals at a target frequency comprising:
determining a first magnitude of a first current to charge a first capacitor to a predetermined voltage during a first portion of a clock signal operating at the target frequency;
determining a second magnitude of a second current to charge a second capacitor to the predetermined voltage during a second portion of the clock signal; and
alternately delivering a third current having a third magnitude to the first capacitor and to the second capacitor to cause a latching circuit to generate the oscillating signals at the target frequency, the third magnitude of the third current being based on the first magnitude of the first current and the second magnitude of second current.

13. The method defined in claim 12, in which determining the first magnitude of the first current includes:
- initially setting each respective current source of a plurality of current sources to an activated state in response to a respective pulse of a plurality of pulses of the clock signal;
- after each respective pulse of the plurality of pulses, making a respective comparison between a first capacitor voltage occurring across the first capacitor coupled to receive current from the plurality of current sources and a reference voltage; and
- based on each respective comparison made after each respective pulse of the plurality of pulses, causing the respective one of the plurality of current sources initially set in response to the respective pulse to remain in one of an activated or de-activated state in response to subsequent ones of the plurality of pulses.

14. The method defined in claim 13, in which the respective current sources correspond to respective bits of a binary word representing a quantization level, and the respective current sources are initially set to the activated state in an order based on a significance of the corresponding bit.

15. The method defined in claim 14, in which a first current source of the plurality of current sources corresponds to a most significant bit in the binary word and is initially set to the activated state in response to a first pulse of the plurality of pulses and a second current source corresponding to a least significant bit in the binary word is initially set to the activated state in response to a last pulse of the plurality of pulses.

16. The method defined in claim 12, in which the first portion of the clock signal corresponds to the clock signal being at a first logic level and the second portion of the clock signal corresponds to the clock signal being at a second logic level.

17. The method defined in claim 15, in which the plurality of current sources is a first plurality of current sources, in which determining the first magnitude of the first current includes making a first set of comparisons between a plurality of first capacitor voltages across the first capacitor coupled to receive current from the first plurality of current sources and the predetermined voltage, and determining the second magnitude of the second current includes making a second set of comparisons between a plurality of second capacitor voltages occurring across the second capacitor coupled to receive current from a second plurality of current sources and the predetermined voltage.

18. The method defined in claim 17, further including:
- based on respective ones of the first set of comparisons, determining whether to adjust respective amounts of current generated by respective ones of the first plurality of current sources; and
- based on respective ones of the second set of comparisons, determining whether to adjust respective amounts of current generated by respective ones of the second plurality of current sources.

19. The method defined in claim 12, in which alternately delivering a third current having a third magnitude to the first capacitor and to the second capacitor to cause the latching circuit to generate the oscillating signals at the target frequency includes:
- delivering the third current to the first capacitor until the first capacitor reaches or exceeds the predetermined voltage and causes a first comparator output to change;
- latching the first comparator output with a latching circuit to cause an output of the latching circuit to supply a first signal for a first duration of time;
- delivering the third current to the second capacitor until the second capacitor reaches or exceeds the predetermined voltage and causes a second comparator output to change; and
- latching the second comparator output with the latching circuit to cause the output of the latching circuit to supply a second signal for a second duration of time, the sum of the first duration of time and the second duration of time being equal to a clock cycle of the clock signal.

\* \* \* \* \*